US010226863B2

(12) United States Patent
Yazawa et al.

(10) Patent No.: US 10,226,863 B2
(45) Date of Patent: Mar. 12, 2019

(54) INDUSTRIAL ROBOT

(71) Applicant: NIDEC SANKYO CORPORATION, Suwa-gun, Nagano (JP)

(72) Inventors: Takayuki Yazawa, Nagano (JP); Yoshihisa Masuzawa, Nagano (JP); Tomoki Tanabe, Nagano (JP); Hirokazu Watanabe, Nagano (JP)

(73) Assignee: NIDEC SANKYO CORPORATION, Nagano (JP)

( * ) Notice: Subject to any disclaimer, the term of this patent is extended or adjusted under 35 U.S.C. 154(b) by 169 days.

(21) Appl. No.: 15/185,950

(22) Filed: Jun. 17, 2016

(65) Prior Publication Data
US 2016/0368137 A1 Dec. 22, 2016

Related U.S. Application Data

(62) Division of application No. 14/386,579, filed as application No. PCT/JP2013/070160 on Jul. 25, 2013, now Pat. No. 9,764,461.
(Continued)

(30) Foreign Application Priority Data

Nov. 9, 2012 (JP) ................................ 2012-247111
Nov. 9, 2012 (JP) ................................ 2012-247112
(Continued)

(51) Int. Cl.
*B25J 9/00* (2006.01)
*B25J 9/04* (2006.01)
(Continued)

(52) U.S. Cl.
CPC ............... *B25J 9/042* (2013.01); *B25J 9/126* (2013.01); *B25J 11/0095* (2013.01);
(Continued)

(58) Field of Classification Search
USPC .................................................. 700/245–264
See application file for complete search history.

(56) References Cited

U.S. PATENT DOCUMENTS 3,103,498 A 9/1963 James et al.
4,602,195 A 7/1986 Eberle et al.
(Continued)

FOREIGN PATENT DOCUMENTS

EP         0121576 A1    10/1983
JP         62282303 A    12/1987
(Continued)

OTHER PUBLICATIONS

U.S. Non-Final Office Action U.S. Appl. No. 14/386,579 dated Jul. 21, 2016.
(Continued)

*Primary Examiner* — Jonathan L Sample
(74) *Attorney, Agent, or Firm* — Cantor Colburn LLP

(57) ABSTRACT

The present invention is to provide an industrial robot, which is placed in vacuum for use, capable of efficiently cooling down hand- or arm-driving motors which are arranged inside the arm in air. The industrial robot is provided with a motor for rotating a second arm unit with respect to a first arm unit, a motor for rotating a hand with respect to the second arm unit, a reduction gear for reducing the rotation of the motor and transmitting it to the second arm unit, and a reduction gear for reducing the rotation of the motor and transmitting it to the hand; the hand and the arm are placed in vacuum. The reduction gears and are coaxially arranged so that the center of rotation of the second arm unit with respect to the first arm unit coincides with the axial centers of the reduction gears. The interior space of the hollow first arm unit is kept at atmospheric pressure in which the motors and the reduction gears are arranged.

4 Claims, 17 Drawing Sheets

Related U.S. Application Data

(60) Provisional application No. 61/681,261, filed on Aug. 9, 2012.

(30) Foreign Application Priority Data

| Nov. 9, 2012 | (JP) | ................................ 2012-247113 |
| Nov. 9, 2012 | (JP) | ................................ 2012-247114 |

(51) Int. Cl.
  *B25J 19/00* (2006.01)
  *H01L 21/677* (2006.01)
  *B25J 21/00* (2006.01)
  *B25J 11/00* (2006.01)
  *B25J 9/12* (2006.01)

(52) U.S. Cl.
  CPC ......... *B25J 19/002* (2013.01); *B25J 19/0054* (2013.01); *B25J 21/005* (2013.01); *H01L 21/67742* (2013.01); *Y10S 901/23* (2013.01); *Y10S 901/25* (2013.01); *Y10S 901/48* (2013.01); *Y10T 74/20317* (2015.01)

(56) References Cited

U.S. PATENT DOCUMENTS

| 4,620,831 A | 11/1986 | Poncet et al. |
| 4,680,519 A | 7/1987 | Chand et al. |
| 4,823,279 A | 4/1989 | Perzley et al. |
| 4,977,971 A * | 12/1990 | Crane, III .................. B25J 5/00 180/8.3 |
| 5,007,784 A | 4/1991 | Genov et al. |
| 5,056,038 A * | 10/1991 | Kuno ...................... B25J 9/1633 700/260 |
| 5,064,340 A | 11/1991 | Genov et al. |
| 5,155,423 A * | 10/1992 | Karlen ........................ B25J 9/04 318/568.1 |
| 5,353,386 A * | 10/1994 | Kasagami ............... B25J 9/1682 700/247 |
| 5,634,377 A | 6/1997 | Kimura et al. |
| 5,737,500 A * | 4/1998 | Seraji ...................... B25J 9/1643 318/568.11 |
| 5,771,748 A | 6/1998 | Genov et al. |
| 5,777,450 A | 7/1998 | Kono et al. |
| 5,784,542 A * | 7/1998 | Ohm .......................... B25J 3/04 700/247 |
| 5,798,627 A * | 8/1998 | Gilliland ................ B25J 9/1671 318/568.13 |
| 5,814,956 A | 9/1998 | Kono et al. |
| 5,920,171 A * | 7/1999 | Kim ...................... G01D 5/2457 318/568.16 |
| 5,954,840 A | 9/1999 | Genov et al. |
| 5,956,465 A * | 9/1999 | Takagi ............. G05B 19/41815 700/178 |
| 6,121,743 A | 9/2000 | Genov et al. |
| 6,364,888 B1 * | 4/2002 | Niemeyer ............ H04N 13/327 606/130 |
| 6,424,885 B1 * | 7/2002 | Niemeyer ............ A61B 34/70 600/109 |
| 6,519,860 B1 * | 2/2003 | Bieg ........................ B23H 7/26 33/1 PT |
| 6,766,204 B2 * | 7/2004 | Niemeyer ............ H04N 13/327 170/1 |
| 6,853,879 B2 | 2/2005 | Sunaoshi |
| 6,893,204 B1 | 5/2005 | Suzuki et al. |
| 8,136,422 B2 * | 3/2012 | Kitahara ................ B25J 9/042 318/568.21 |
| 8,434,992 B2 * | 5/2013 | Tara ........................ B25J 9/042 414/744.3 |
| 8,504,199 B1 * | 8/2013 | Yasuda ................. B25J 9/1643 700/245 |
| 9,076,829 B2 * | 7/2015 | Brodine ............ H01L 21/67742 |
| 9,119,655 B2 * | 9/2015 | Bowling ................ A61B 34/32 |
| 2001/0020199 A1 * | 9/2001 | Bacchi ..................... B25J 9/042 700/245 |
| 2003/0033024 A1 * | 2/2003 | Sunaoshi ............... B25J 9/1689 700/3 |
| 2003/0208302 A1 * | 11/2003 | Lemelson .............. G05B 19/19 700/245 |
| 2004/0254680 A1 * | 12/2004 | Sunaoshi ............... A61B 34/70 700/253 |
| 2005/0021177 A1 | 1/2005 | Bacchi et al. |
| 2006/0173578 A1 * | 8/2006 | Takenaka ............. B62D 57/032 700/245 |
| 2006/0241414 A1 * | 10/2006 | Nowlin .................. A61B 34/70 600/431 |
| 2007/0010913 A1 * | 1/2007 | Miyamoto ............ B25J 9/1658 700/264 |
| 2007/0096670 A1 | 5/2007 | Hashimoto et al. |
| 2007/0118250 A1 * | 5/2007 | Nagamatsu ........... B25J 9/1666 700/251 |
| 2008/0041183 A1 | 2/2008 | Todorov |
| 2008/0066207 A1 * | 3/2008 | Beniyama ................ B25J 5/007 700/245 |
| 2008/0109115 A1 * | 5/2008 | Lim ...................... B62D 57/032 700/258 |
| 2008/0114494 A1 * | 5/2008 | Nixon .................... B25J 9/1692 700/254 |
| 2008/0121064 A1 | 5/2008 | Todorov |
| 2008/0132913 A1 * | 6/2008 | Brock ................ A61B 17/0469 606/130 |
| 2008/0154246 A1 * | 6/2008 | Nowlin .................. G16H 50/50 606/1 |
| 2008/0235970 A1 * | 10/2008 | Crampton ............. B25J 13/088 33/503 |
| 2008/0309273 A1 | 12/2008 | Kamiya |
| 2009/0000136 A1 * | 1/2009 | Crampton ............. B25J 13/088 33/503 |
| 2009/0088774 A1 * | 4/2009 | Swarup .................. A61B 34/37 606/130 |
| 2009/0095111 A1 | 4/2009 | Kitahara et al. |
| 2009/0266194 A1 | 10/2009 | Zhang et al. |
| 2010/0079099 A1 * | 4/2010 | Katsuki ............. G05B 23/0256 318/565 |
| 2010/0191374 A1 * | 7/2010 | Tsai ..................... G05B 19/404 700/258 |
| 2010/0298977 A1 * | 11/2010 | Fahn ..................... G05D 1/0246 700/259 |
| 2010/0300230 A1 * | 12/2010 | Helmer .................... B25J 9/106 74/469 |
| 2011/0071675 A1 * | 3/2011 | Wells .................... G06K 9/3216 700/250 |
| 2011/0118748 A1 * | 5/2011 | Itkowitz ................. A61B 34/30 606/130 |
| 2011/0135437 A1 | 6/2011 | Takeshita et al. |
| 2011/0213497 A1 * | 9/2011 | Nair ...................... B25J 9/1666 700/255 |
| 2012/0061155 A1 * | 3/2012 | Berger .................... B25J 5/007 180/21 |
| 2013/0245829 A1 * | 9/2013 | Ohta ..................... B25J 9/1633 700/261 |
| 2013/0271046 A1 | 10/2013 | Sussman |
| 2013/0272822 A1 | 10/2013 | Furukawa et al. |
| 2014/0001165 A1 | 1/2014 | Takemoto et al. |
| 2014/0067124 A1 * | 3/2014 | Williamson ......... G05B 19/406 700/258 |

FOREIGN PATENT DOCUMENTS

| JP | 04267791 A | 9/1992 |
| JP | H06269763 A | 9/1994 |
| JP | 07246579 A | 9/1995 |
| JP | 07299777 A | 11/1995 |
| JP | 08188761 A | 7/1996 |
| JP | 08216072 A | 8/1996 |
| JP | 08172121 A | 9/1996 |
| JP | H09150388 A | 6/1997 |
| JP | 2000237988 A | 9/2000 |
| JP | 2002218676 A | 8/2002 |

(56) References Cited

FOREIGN PATENT DOCUMENTS

| | | |
|---|---|---|
| JP | 2005039047 A | 2/2005 |
| JP | 2006012074 A | 1/2006 |
| JP | 2008221428 A | 9/2008 |
| JP | 2009090383 A | 4/2009 |
| JP | 2010052055 A | 3/2010 |
| JP | 2010284728 A | 12/2010 |
| JP | 2011101912 A | 5/2011 |
| JP | 2011230256 A | 11/2011 |
| WO | 2012008321 A | 1/2012 |

OTHER PUBLICATIONS

International Search Report for International Application No. PCT/JP2013/070160; dated Nov. 12, 2013; with English translation.
U.S. Final Office Action corresponding to U.S. Appl. No. 14/386,579; dated Jan. 30, 2017.
USPTO Non-Final Office Action corresponding to U.S. Appl. No. 15/185,962; dated Nov. 29, 2017.
USPTO Non-Final Office Action corresponding to U.S. Appl. No. 15/185,974; dated Jun. 15, 2018.
USPTO Non-Final Office Action corresponding to U.S. Appl. No. 15/185,962; dated Sep. 10, 2018.
U.S. Notice of Allowance corresponding to U.S. Appl. No. 15/185,974; dated Dec. 6, 2018.

\* cited by examiner

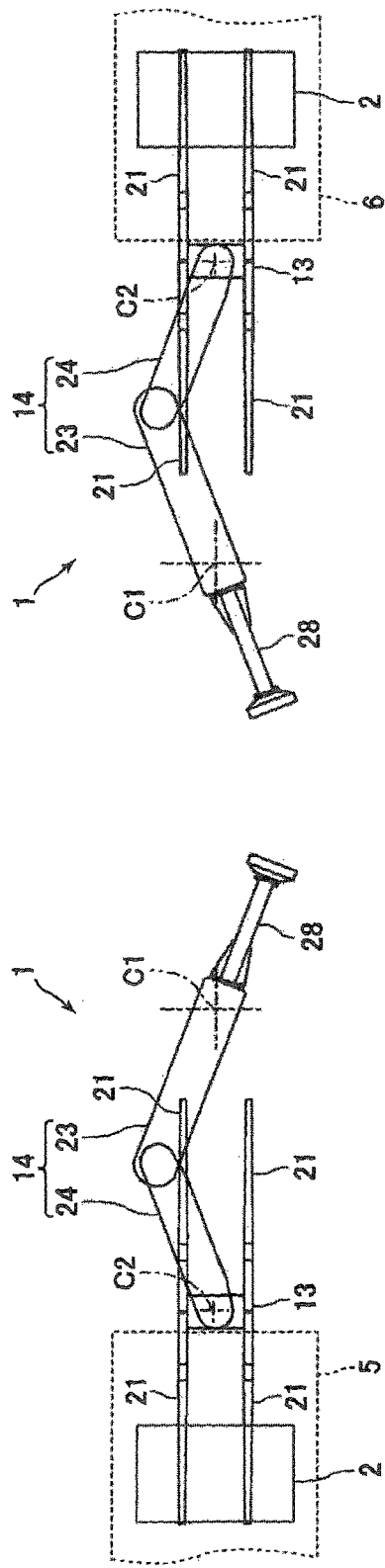
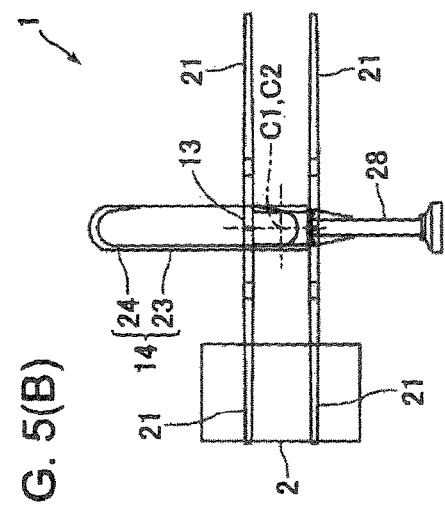
FIG. 5(A)  FIG. 5(B)  FIG. 5(C)

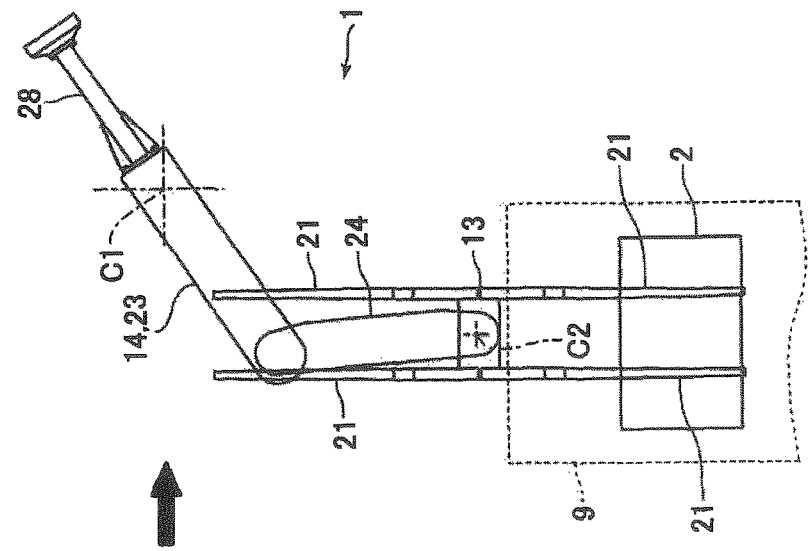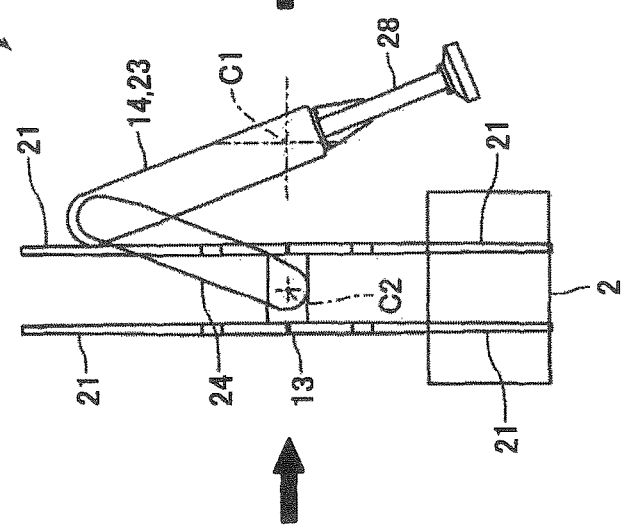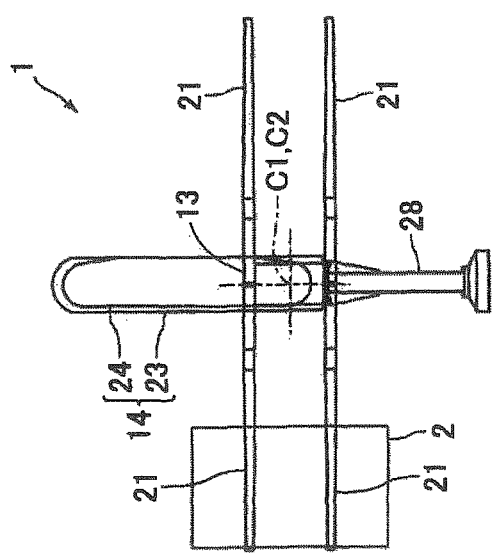

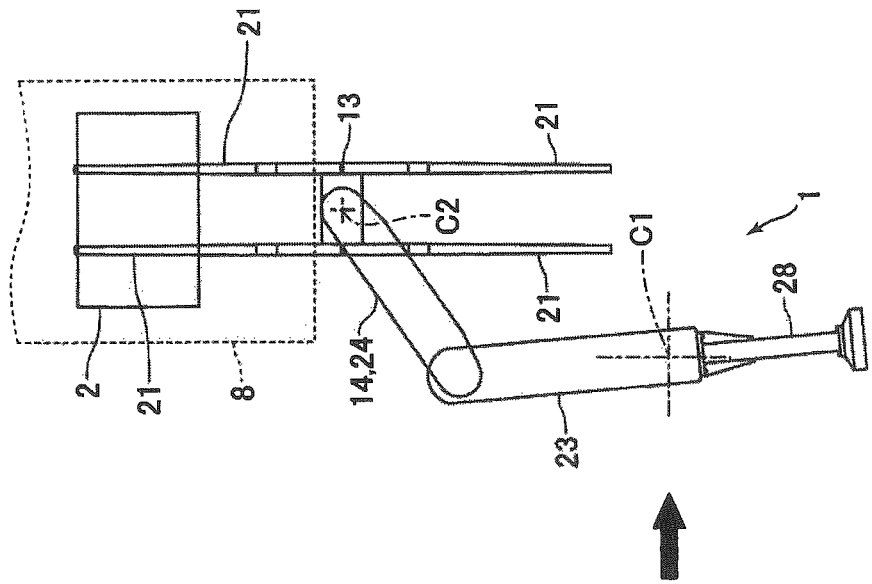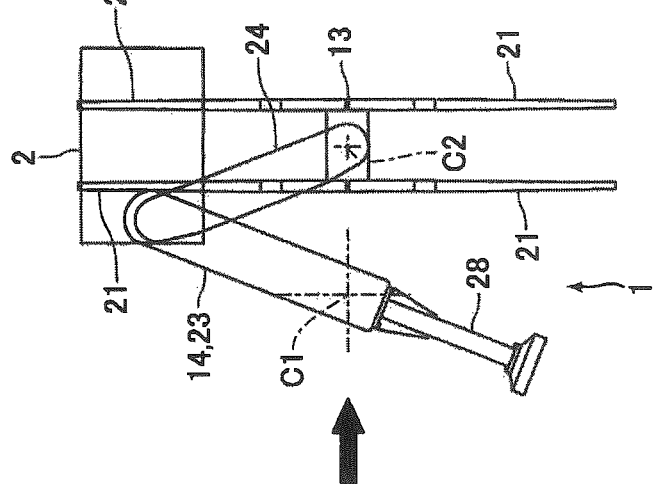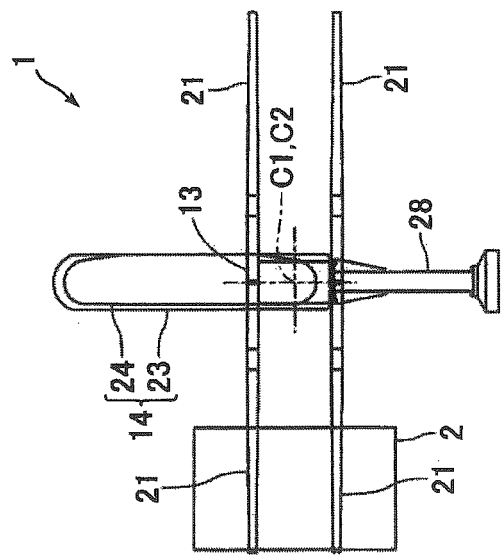

INDUSTRIAL ROBOT

CROSS REFERENCE TO RELATED APPLICATIONS

The present application is a divisional application of U.S. patent application Ser. No. 14/386,579, filed on Sep. 19, 2014, the entire contents of which are incorporated herein by reference. The Ser. No. 14/386,579 is the U.S. national stage of International Application No. PCT/JP2013/070160, filed on Jul. 25, 2013. Priority under 35 U.S.C. § 119(a) and 35 U.S.C. § 365(b) is claimed from Japanese Application Nos. 2012-247111, filed on Nov. 9, 2012; 2012-247112, filed on Nov. 9, 2012; 2012-247113, filed on Nov. 9, 2012; and 2012-247114, filed on Nov. 9, 2012. Priority is also claimed under 35 U.S.C. § 119(e) to U.S. Provisional Application No. 61/681,261, filed on Aug. 9, 2012.

FIELD OF THE INVENTION

At least an embodiment relates to an industrial robot which is used in vacuum.

At least an embodiment relates to an industrial robot original position returning method by which an industrial robot is returned to the original position. At least an embodiment also relates to an industrial robot equipped with a hand and an arm.

At least an embodiment relates to an industrial robot which has an arm configured by relatively-rotatably linked multiple arm units.

At least an embodiment relates to an industrial robot which has an arm configured by relatively-rotatably linked multiple arm units, and to a control method of the industrial robot.

BACKGROUND

A vacuum robot is conventionally known for handling substrates in vacuum (Patent reference 1, for example). A vacuum robot disclosed in Patent reference 1 is equipped with a hand on which a substrate is mounted, an arm to which the hand is linked to the front end thereof, and a main body unit to which the base end of the arm is linked. The arm is configured by an arm base which is rotatably linked to the main body unit, a first arm which is rotatably linked to the arm base with the base end thereof and a second arm which is rotatably linked to the front end of the first arm with the base end thereof. The arm base and the first arm are formed hollow. Arranged inside the arm base are an arm-driving motor which drives the arm and a first reduction gear which reduces the rotation of the arm-driving motor and transmits it to the first arm. The base end of the first arm is fixed to the output shaft of the first reduction gear. A second reduction gear for reducing the rotation of the arm-driving motor and transmitting it to the second arm is arranged on the front end side of the first arm. The base end of the second arm is fixed to the output shaft of the second reduction gear.

In the vacuum robot disclosed in Patent reference 1, part of the main body unit is fixed to the bottom surface of a vacuum vessel, and the arm and the hand are arranged in vacuum. The interior space of the hollow arm base and the first arm is kept airtight atmospheric pressure. Therefore, even if the arm of this vacuum robot is placed in vacuum, there is no need to use an expensive lubricant such as vacuum grease for the first reduction gear and the second reduction gear, but a lubricant such as grease used at atmospheric pressure may be used. Consequently, the initial cost and the running cost of the vacuum robot can be reduced. Also, in the vacuum robot, even if the arm is arranged in vacuum, the arm-driving motor, which is arranged inside the arm base, can be cooled because the interior space of the arm base and the first arm is at atmospheric pressure.

Next, conventionally known is an original position returning method for returning an industrial robot, which performs a series of operations through a control program, to the original position from the position of an emergency stop (Patent reference 2, for example). In the original position returning method disclosed in Patent reference 2, an industrial robot is operated to perform predetermined operations to return to the original position, based on the coordinates of the current position of the industrial robot at the time of the emergency stop (the current status) recorded in a robot controller and the coordinates of the actual current position of the robot at the time of the emergency stop acquired based on the detection result by an encoder.

Also conventionally known is an articulated industrial robot which has an arm configured by multiple arm units (Patent reference 3, for example). The industrial robot disclosed in Patent reference 3 is equipped with an arm configured by a first arm unit which is rotatably linked to a main body unit, a second arm unit which is rotatably linked to the first arm unit and a third arm unit which is rotatably linked to the third arm unit, and two hands which are rotatably linked to the third arm unit. This industrial robot is also equipped with a first driving motor for driving the first arm unit and the second arm unit, a second driving motor for driving the third arm unit, and two driving motors for respectively driving the two hands. This industrial robot is placed at the entrance of a semiconductor manufacturing system, and takes semiconductors out of a cassette in which the wafers are stored and stores them in a predetermined processor.

Further, conventionally known is a semiconductor-handling robot which handles semiconductor wafers (Patent reference 4, for example). The handling robot disclosed in Patent reference 4 is a horizontal articulated tri-axial robot equipped with an elevating shaft which is provided to a base, an arm which is rotatably linked to the elevating shaft with the base end thereof, and a hand which is rotatably linked to the front end of the arm. The arm is configured by a first arm unit which is rotatably linked to the elevating shaft with the base end thereof and a second arm unit which is rotatably linked to the front end of the first arm unit with the base end thereof and to which the hand is rotatably linked to the front end thereof. Also, this handling robot is equipped with three motors for respectively driving the first arm unit, the second arm unit and the hand.

In the handling robot disclosed in Patent reference 4, the position of the hand is controlled based on the cylindrical coordinate system that uses the center of rotation of the first arm unit with respect to the elevating shaft as the original point. Also, disclosed in Patent reference 1 is an auto-teaching method to automatically teach the moving position of the hand to extend/fold in the arm so that the hand moves in a straight line on the line passing the center of rotation of the first arm unit when viewed in the top-bottom direction (that is, the hand moves in the radial direction of the cylindrical coordinate system). Note that there is a disclosure in Patent reference 4 that the position of the hand may be controlled based on the XY coordinate system.

The handling robot disclosed in Patent reference 4 is used in a semiconductor manufacturing system to manufacture semiconductors. In a semiconductor manufacturing system, conventionally, a semiconductor wafer processor is arranged radially having the center of rotation of the first arm unit as a center when viewed in the top-bottom direction; the handling robot moves the hand radially having the center of rotation of the first arm unit as a center (that is, the robot moves the hand on the straight line passing the center of rotation of the first arm unit) to handle a semiconductor wafer.

PATENT REFERENCE

[Patent reference 1] Unexamined Japanese Patent Application 2011-101912 Publication
[Patent reference 2] Unexamined Japanese Patent Application 2009-090383 Publication
[Patent reference 3] Unexamined Japanese Patent Application 2011-230256 Publication
[Patent reference 4] Unexamined Japanese Patent Application 2010-284728 Publication In recent years, objects-to-be-handled, such as substrates, which are handled in vacuum have been upsized. For example, if a substrate that is handled by a vacuum robot disclosed in Patent reference 1 is upsized, the work load on an arm-driving motor becomes large, resulting in larger heat generation of the arm-driving motor. Therefore, in the vacuum robot disclosed in Patent reference 1, the arm-driving motor may be damaged by the influence of heat unless the arm-driving motor is efficiently cooled down.

SUMMARY

At least an embodiment of the invention provides an industrial robot, in which at least part of the inside of an arm arranged in vacuum is kept at atmospheric pressure, capable of efficiently cooling down a hand and an arm-driving motor arranged in atmosphere inside the arm.

As described above, by the original position returning method disclosed in Patent reference 2, it is possible to return an industrial robot which has grasped the coordinates of its current position (the current status) to the original position from the position of the emergency stop. However, the original position returning method disclosed in Patent reference 2 cannot return the industrial robot to the original position which has made an emergency stop, having lost the coordinates of its current position for some reasons.

At least an embodiment of the invention provides an original position returning method capable of returning an industrial robot to the original position with a simple method even when the industrial robot has stopped, having lost the coordinates of its current position. Also, at least an embodiment of the invention provides an industrial robot capable of returning to the original position with a simple method even when having stopped, having lost the coordinates of its current position.

In a system such as a semiconductor manufacturing system in which an industrial robot is used, a situation may arise where the industrial robot needs to make an emergency stop for safety. In this case, power to the industrial robot is immediately cut off to stop the industrial robot in general.

However, as in the industrial robot disclosed in Patent reference 3 which is provided with a first driving motor for driving a first arm unit and a second arm unit, a second driving motor for driving a third arm unit and two hand-driving motors for respectively driving the two hands, if the power source for supplying electricity to the first driving motor, the second driving motor and the hand-driving motors is turned off to have the industrial robot to make an emergency stop when the first arm unit, the second arm unit, the third arm unit and the hands are in operation, the first arm unit, the second arm unit, the third arm unit and the hands may rotate individually by themselves due to the inertia of the first and second arm unit in operation, the inertia of the third arm unit in operation and the inertia of the hand in operation, until the first arm unit, the second arm unit, the third arm unit and the hand come to a stop. If the first arm unit, the second arm unit, the third arm unit and the hand rotates individually by themselves until they come to a stop, the first arm unit, the second arm unit, the third arm unit or the hand may collide with the cassette in which semiconductor wafers are stored or the processor in which the semiconductor wafers are processed, causing unexpected accidents.

At least an embodiment of the invention provides an industrial robot which has an arm configured by relatively-rotatably linked multiple arm units, capable of making an emergency stop while keeping the arm in a predetermined position even when multiple motors are provided for driving the multiple arm units, and to provide a method for controlling the industrial robot.

As described above, in the semiconductor manufacturing system in which the handling robot disclosed in Patent reference 4 is used, a semiconductor wafer processor is arranged radially having the center of rotation of the first arm unit as a center when viewed in the top-bottom direction. If the semiconductor wafer processor is arranged raidally, however, the semiconductor manufacturing system easily requires a larger installation area; therefore, there is a need to modify the layout of the processor to reduce the installation area of the semiconductor manufacturing system. On the other hand, the modified layout of the processor may force the hand be moved on a straight line which is not along the straight line passing the center of rotation of the first arm unit when viewed in the top-bottom direction, to handle a semiconductor wafer.

The handling robot disclosed in Patent reference 4 is equipped with three motors for respectively driving the first arm unit, the second arm unit and the hand; therefore, it is possible to move the hand on a straight line in a position not along the straight line passing the center of rotation of the first arm unit when viewed in the top-bottom direction. However, the teaching of the moving position of the hand may become troublesome if the hand is to be moved on a straight line in a position not along the straight line passing the center of rotation of the first arm unit when viewed in the top-bottom direction.

At least an embodiment of the invention provides an industrial robot which is equipped with an arm configured by relatively-rotatably linked multiple arm units, multiple motors for driving the multiple arm units and a main body unit to which the base end of the arm is rotatably linked, capable of easily teaching the moving position of the front end of the arm even when the front end of the arm moves on a straight line which is not along an imaginary line passing the center of rotation of the arm with respect to the main body unit when viewed in the axial direction of the rotation of the arm.

At least an embodiment of the invention provides to provide a method of controlling an industrial robot which is equipped with an arm configured by relatively-rotatably linked multiple arm units, multiple motors for driving the multiple arm units and a main body unit to which the base end of the arm is rotatably linked, capable of easily teaching the moving position of the front end of the arm even when the front end of the arm is moved on a straight line in a position not along an imaginary line passing the center of rotation of the arm with respect to the main body unit when viewed in the axial direction of the rotation of the arm.

At least an embodiment of the industrial robot comprises a main body unit, an arm configured by a first arm unit which is rotatably linked to the main body unit with the base end thereof and a second arm unit which is rotatably linked to the front end of the first arm unit with the base end thereof, a hand which is rotatably linked to the front end of the second arm unit, a first motor for rotating the second arm unit with respect to the first arm unit, a second motor for rotating the hand with respect to the second arm unit, a first reduction gear for reducing the rotation of the first motor and transmitting it to the second arm unit, and a second reduction gear for reducing the rotation of the second motor and transmitting it to the hand; wherein the hand and the arm are arranged in vacuum; the first reduction gear and the second reduction gear are hollow reduction gears in which a through hole is formed in the center thereof in the radial direction; the first reduction gear and the second reduction gear are coaxially placed on top of the other so that the center of rotation of the second arm unit with respect to the first arm unit or the center of rotation of the hand with respect to the second arm unit coincides with the axial center of the first reduction gear and the axial center of the second reduction gear, and they configure at least part of a first joint section connecting the first arm unit and the second arm unit or a second joint section connecting the second arm unit and the hand; the first motor, the second motor, the first reduction gear and the second reduction gear are arranged in the interior space of the hollow first arm unit or second arm unit, and the interior space is at atmospheric pressure.

In at least an embodiment of the industrial robot, the interior space of the hollow first arm unit or second arm unit is kept at atmospheric pressure, and the first motor, the second motor, the first reduction gear and the second reduction gear are arranged in this interior space. Also, the first reduction gear and the second reduction gear arranged in the interior space are coaxially on top of the other so that the axial centers thereof align with each other. Therefore, the interior space can be increased in the axial direction of the first reduction gear and the second reduction gear. In other words, the capacity of the interior space kept at atmospheric pressure is increased so that the amount of air in the interior space is increased. Therefore, the first motor and the second motor arranged in the interior space at atmospheric pressure can efficiently be cooled down. Also, the two reduction gears are arranged on the center of rotation of the second arm unit with respect to the first arm unit or on the center of rotation of the hand with respect to the second arm unit; therefore, the rigidity of the first joint section or the second joint section can be enhanced.

It is preferred that the first arm unit and the hand rotate such that the rotating angle of the first arm unit with respect to the main body unit is the same as that of the hand with respect to the second arm unit and the rotating direction of the first arm unit with respect to the main body unit is opposite that of the hand with respect to the second arm unit when an object-to-be-handled is transferred from/to the storage unit in which objects-to-be-handled are stored. With this configuration, the hand can be kept in a fixed direction at the time of handling the object-to-be-handled. In other words, the hand can be kept in a fixed direction at the time of handling an object-to-be-handled through a relatively easy control.

The first arm unit is attached to the main body unit to outstretch from the main body unit to one side in the horizontal direction, and a counterweight is attached to the first arm unit to outstretch from the main body unit to the other side in the horizontal direction, for example. In this case, the work load exerting on the bearing that supports the first arm unit to rotate can be reduced.

To achieve the above-described objectives, at least an embodiment the industrial robot comprises a main body unit, an arm configured by a first arm unit which is rotatably linked to the main body unit with the base end thereof, a second arm unit which is rotatably linked to the front end of the first arm unit with the base end thereof and a third arm unit which is rotatably linked to the front end of the second arm unit with the base end thereof, a hand which is rotatably linked to the front end of the third arm unit, a first motor for rotating the second arm unit with respect to the first arm unit, a second motor for rotating the third arm unit with respect to the second arm unit, a third motor for rotating the hand with respect to the third arm unit, a first reduction gear for reducing the rotation of the first motor and transmitting it to the second arm unit, a second reduction gear for reducing the rotation of the second motor and transmitting it to the third arm unit and a third reduction gear for reducing the rotation of the third motor and transmitting it to the hand; wherein the hand and the arm are arranged in vacuum; the first reduction gear, the second reduction gear and the third reduction gear are hollow reduction gears in which a through hole is formed in the center thereof in the radial direction; at least two of the first reduction gear, the second reduction gear and the third reduction gear are coaxially placed on top of the other so that the axial centers thereof coincide with the center of rotation of the second arm unit with respect to the first arm unit, the center of rotation of the third arm unit with respect to the second arm unit or the center of rotation of the hand with respect to the third arm unit, and they configure at least part of a first joint section connecting the first arm unit and the second arm unit, a second joint section connecting the second arm unit and the third arm unit, or a third joint section connecting the third arm unit and the hand; the two or more reduction gears that are coaxially placed on top of the other and two or more motors out of the first motor, the second motor and the third motor which are respectively connected with the said two or more reduction gears are arranged in the interior space of the hollow first arm unit, the second arm unit or the third arm unit, and the interior space is kept at atmospheric pressure.

In the industrial robot, the interior space of the hollow first arm unit, second arm unit or third arm unit is kept at atmospheric pressure, and two or more reduction gears out of the first reduction gear, the second reduction gear and the third reduction gear and two or more motors out of the first motor, the second motor and the third motor which are respectively connected to the said two or more reduction gears are arranged in the interior space. Further, the two or more reduction gears arranged in the interior space are coaxially placed on top of the other so that the axial centers thereof align with each other. Therefore, the interior space of the reduction gears in the axial direction can be increased. In other words, the amount of air inside the interior space can be increased by increasing the capacity of the interior space kept at atmospheric pressure. Therefore, the two or more motors arranged in the interior space at atmospheric pressure can efficiently be cooled down. Furthermore, the two or more reduction gears are arranged on the center of rotation of the second arm unit with respect to the first arm unit, the center of rotation of the third arm unit with respect to the second arm unit or the center of rotation of the hand with respect to the third arm unit; therefore, rigidity of the first joint section, the second joint section or the third joint section can be increased.

Further, to achieve the above-described objectives, at least an embodiment of the industrial robot may include a main body unit, an arm configured by a first arm unit which is rotatably linked to the main body unit with the base end thereof, a second arm unit which is rotatably linked to the front end of the first arm unit with the base end thereof, and a third arm unit which is rotatably linked to the front end of the second arm unit with the base end thereof, a hand which is roatably linked to the front end of the third arm unit, a first motor for actuating the arm to extend/fold in, a second motor for rotating the hand with respect to the third arm unit, a first reduction gear for reducing the rotation of the first motor and transmitting it to the arm and a second reduction gear for reducing the rotation of the second motor and transmitting it to the hand; wherein the hand and the arm are arranged in vacuum; the first reduction gear and the second reduction gear are hollow reduction gears in which a through hole is formed in the centers thereof in the radial direction thereof; the first and second reduction gears are arranged coaxially on top of the other so that the axial centers thereof coincide with the center of rotation of the second arm unit with respect to the first arm unit, the center of rotation of the third arm unit with respect to the second arm unit or the center of rotation of the hand with respect to the third arm unit, and they also configure at least part of a first joint connecting the first arm unit and the second arm unit, a second joint section connecting the second arm unit and the third arm unit, or a third joint section connecting the third arm unit and the hand; the first motor, the second motor, the first reduction gear and the second reduction gear are arranged in the interior space of the hollow first arm unit, second arm unit or third arm unit; the interior space is kept at atmospheric pressure.

In the industrial robot, the interior space of the hollow first arm unit, second arm unit or third arm unit is kept at atmospheric pressure, and the first motor, the second motor, the first reduction gear and the second reduction gear are arranged in the said interior space. Also, the first reduction gear and the second reduction gear arranged in the interior space are coaxially placed on top of the other so that the axial centers thereof align with each other. Therefore, the interior space can be increased in the axial direction of the first reduction gear and the second reduction gear. In other words, the capacity of the interior space at atmospheric pressure can be increased to increase the amount of air in the interior space. Therefore, the first motor and the second motor arranged in the interior space which is kept at atmospheric pressure can efficiently be cooled down. Also, the two reduction gears are arranged on the center of rotation of the second arm unit with respect to the first arm unit, the center of rotation of the third arm unit with respect to the second arm unit or the center of rotation of the hand with respect to the third arm unit; therefore, rigidity of the first joint section, the second joint section or the third joint section can be increased.

Furthermore, to achieve the above-described objective, at least an embodiment of the industrial robot may include a main body unit, an arm configured by a first arm unit which is rotatably linked to the main body unit with the base end thereof, a second arm unit which is rotatably linked to the front end of the first arm unit with the base end thereof, a third arm unit which is rotatably linked to the front end of the second arm unit with the base end thereof and a fourth arm unit which is rotatably linked to the front end of the third arm unit with the base end thereof, a hand which is rotatably linked to the front end of the fourth arm unit, a first motor for rotating the second arm unit with respect to the first arm unit, a second motor for rotating the third arm unit with respect to the second arm unit, a third motor for rotating the fourth arm unit with respect to the third arm unit, a fourth motor for rotating the hand with respect to the fourth arm unit, a first reduction gear for reducing the rotation of the first motor and transmitting it to the second arm unit, a second reduction gear for reducing the rotation of the second motor and transmitting it to the third arm unit, a third reduction gear for reducing the rotation of the third motor and transmitting it to the fourth arm unit, and a fourth reduction gear for reducing the rotation of the fourth motor and transmitting it the hand; wherein the hand and the arm are arranged in vacuum; the first reduction gear, the second reduction gear, the third reduction gear and the fourth reduction gear are arranged coaxially on top of the other so that the axial centers thereof coincide with the center of rotation of the second arm unit with respect to the first arm unit, the center of rotation of the third arm unit with respect to the second arm unit, the center of rotation of the fourth arm unit with respect to the third arm unit or the center of rotation of the hand with respect to the fourth arm unit, and they also configure at least part of a first joint section connecting the first arm unit with the second arm unit, a second joint section connecting the second arm unit and the third arm unit, a third joint section connecting the third arm unit the fourth arm unit or a fourth joint section between the fourth arm unit and the hand; two or more reduction gears, which are arranged coaxially on top of the other, and two or more motors out of the first, second, third and fourth motors, which are respectively connected to the said two or more of the reduction gears, are arranged in the interior space of the hollow first arm unit, second arm unit, third arm unit or fourth arm unit; the interior space is kept at atmospheric pressure.

In the industrial robot, the interior space of the hollow first arm unit, second arm unit, third arm unit or fourth arm unit is kept at atmospheric pressure, in which two or more reduction gears out of the first reduction gear, the second reduction gear, the third reduction gear and the fourth reduction gear and two or more motors out of the first motor, the second motor, the third motor and the fourth motor, which are connected to the said two or more reduction gears, are arranged. Also, the two or more reduction gears arranged in the interior space are coaxially placed on top of the other so that the axial centers thereof align with each other. Therefore, the interior space can be increased in the axial direction of the reduction gears. In other words, the capacity of the interior space kept at atmospheric pressure is increased so that the amount of air inside the interior space can be increased. Therefore, the two or more motors arranged in the interior space at atmospheric pressure can efficiently be cooled down. Further, two or more reduction gears are arranged on the center of rotation of the second arm unit with respect to the first arm unit, the center of rotation of the third arm unit with respect to the second arm unit, the center of rotation of the fourth arm unit with respect to the third arm unit, or the center of rotation of the hand with respect to the fourth arm unit; therefore, rigidity of the first joint section, the second joint section, the third joint section or the fourth joint section can be enhanced.

At least an embodiment of an industrial robot original position returning method, by which an industrial robot is returned to an original position, may include a temporary current position setting step, in which the coordinates representing a temporary current position of the industrial robot which has stopped having lost the coordinates of its current position is set based on the status of the industrial robot, a moving step in which the industrial robot is moved to a predetermined position after the temporary current position setting step, and a returning step in which, after the moving step, the industrial robot is automatically returned to the original position.

In the industrial robot original position returning method, the coordinates representing a temporary position of the industrial robot halted with its lost coordinates of its current position is set in the temporary current position setting step; therefore, the industrial robot can properly be moved in the moving step, based on the coordinates representing the temporarily-set current position. Also, the industrial robot is moved to a predetermined position in the moving step; therefore, by moving the industrial robot to the position at which the industrial robot can safely be returned to the original position in the moving step, the industrial robot can safely and automatically be returned to the original position in the returning operation step. Thus, according to the original position returning method, the industrial robot which is stopped, having lost the coordinates of its current position can easily and safely returned to the original position, compared to the troublesome method of a manual operation by an operator.

The industrial robot is equipped with a hand on which an object-to-be-handled is mounted, an arm which is configured by rotatably-linked multiple arm units and which the hand is rotatably linked to the front end thereof, multiple arm unit driving motors, and a hand-driving motor for rotating the hand with respect to the arm; wherein the coordinates representing a temporary current position of the center of rotation of the hand with respect to the arm is set in the temporary current position setting step, and the industrial robot is moved in the moving step to the position at which the storage unit storing the objects-to-be-handled and the hand with the object-to-be-handled will not interfere with each other at the time of returning the industrial robot to the original position in the returning operation step.

The industrial robot is equipped with multiple arm unit-driving motors and a hand-driving motor; therefore, the industrial robot which has stopped, having lost the coordinates of its current position can easily be returned to the original position while a manual operation by an operator of returning such an industrial robot to the original position becomes very troublesome. Also, the coordinates representing the temporary current position of the center of rotation of the hand is set in the temporary current position setting step; therefore, the industrial robot can be moved in the moving step so that the hand with the object-to-be-handled and the storage unit do not interfere with each other. At that time, the industrial robot is moved in the moving step to the position at which the storage unit storing objects-to-be-handled does not interfere with the hand and the object-to-be-handled during the time of the returning operation of the industrial robot to the original position in the returning operation step; therefore, the industrial robot can safely and automatically be returned to the original position in the return operation step.

A portable teaching operation terminal which teaches the industrial robot the moving position is connected to the industrial robot; it is preferred that an operator input the coordinates representing a temporary current position of the center of rotation of the hand, which is visually confirmed and determined by the operator, to the teaching operation terminal to set the coordinates representing a temporary current position of the center of rotation of the hand in the temporary current position setting step. With this configuration, the coordinates representing a temporary current position of the center of rotation of the hand can easily be set.

It is preferred that the hand move in a straight line when viewed in the top-bottom direction which is the axial direction of the rotation of the hand, to transfer the object-to-be-handled to and from the storage unit, and that the industrial robot perform a linear interpolation operation in the moving step so that the hand moves in the moving direction of the hand at the time of transferring the object-to-be-handled, when viewed in the top-bottom direction. With this configuration, the industrial robot can be moved so that the hand with the object-to-be-handled and the storage unit do not interfere with each other in the moving step.

It is preferred in the temporary current position setting step that the coordinates representing a temporary current position of the center of rotation of the hand, viewed in the top-bottom direction, can be set by the coordinates by either a cylindrical coordinate system or a rectangular coordinate system, defined in a plane orthogonal to the top-bottom direction which is the axial direction of the rotation of the hand, and the coordinates of a temporary current position of the center of rotation of the hand viewed in the top-bottom direction be set by the coordinates by either a cylindrical coordinate system or a rectangular coordinate system, defined in a plane orthogonal to the top-bottom direction which is the axial direction of the rotation of the hand. With this configuration, the coordinates of a temporary current position of the center of rotation of the hand when viewed in the top-bottom direction can be set by the coordinates by a coordinate system by which the industrial robot is easily moved in the moving step.

It is preferred that the industrial robot be equipped with an operation member to move the industrial robot in the moving step and the industrial robot be operated by a jogging operation by which the industrial robot moves while an operator of the robot operates the operation member and stops when the operator stops operating the operation member. With this configuration, even if the difference is too great between the coordinates representing a temporary current position of the industrial robot, which is set in the temporary current position setting step, and the coordinates representing the actual position of the halted industrial robot, the operation of the industrial robot is continued as it is in the moving step and accordingly the storage unit and the hand interfere with each other, the interference between the storage unit and the hand in the moving step can be prevented by re-setting the coordinates for the temporary current position during the jogging operation.

To achieve the above-described objective, at least an embodiment of the industrial robot, which is equipped with the hand on which an object-to-be-handled is mounted, the arm which is configured by rotatably-linked multiple arm units and of which the hand is rotatably liked to the front side, the multiple arm unit-driving motors and the hand-driving motor, is equipped with a temporary current position setting means to set the coordinates representing the temporary current position of the center of rotation of the hand of the industrial robot which has stopped, having lost the coordinates of its current position of the center of rotation of the hand.

The industrial robot is provided with a temporary current position setting means for setting the coordinates representing a temporary current position of the center of rotation of the hand of the industrial robot which has stopped, having lost the coordinates of the current position of the center of rotation of the hand in relative to the arm. Therefore, the coordinates representing a temporary current position of the center of rotation of the hand can be set by the temporary current position setting means so that the industrial robot can grasp the coordinates representing the temporary current position of the center of rotation of the hand. In this way, the industrial robot can be properly moved to return to the original position. As a result, the industrial robot which has been stopped, having lost the coordinates of its current position can be returned to the original position by the simple method, compared to a troublesome method in which the industrial robot is returned to the original position by a manual operation by an operator.

At least an embodiment of the industrial robot may include an arm which is configured by relatively-rotatably linked multiple arm units is equipped with multiple motors for driving the multiple arm units, multiple motor drivers for respectively driving the multiple motors, a power source for supplying electric power to the multiple motor drivers, a charge-discharge unit which is connected with the multiple motor drivers and is chargeable with regenerative current generated by the multiple motors and a control unit for controlling the multiple motor drivers; wherein power is cut off when the industrial robot makes an emergency stop and the control unit stops the multiple motors while controlling the multiple motor drivers by using the electric power supplied by the charge-discharge unit.

In the industrial robot, the power source to supply electric power to the multiple motor drivers is turned off at the time of an emergency stop. Therefore, the multiple motors can be stopped in a relatively short period of time when the industrial robot makes an emergency stop, securing safety in a relatively short period of time. Also, the control unit stops the multiple motors while controlling the motor drivers, using the power from the discharge/charge section, which is chargeable with regenerative current generated by the multiple motors. In other words, the multiple motors are stopped while the control unit controls the motor drivers by using the electric power supplied by the discharge/charge unit, when the industrial robot makes an emergency stop. Therefore, even when the industrial robot is equipped with multiple motors for driving the multiple arm units to rotate, the industrial robot can make an emergency stop having the position of the arm in a fixed state.

It is preferred that the industrial robot be equipped with a hand which is rotatably linked to the front end of the arm, a hand-driving motor for rotating the hand with respect to the arm and a hand-driving motor driver for driving the hand-driving motor, and that the control unit stop the hand-driving motor while controlling the motor driver for the hand by using the electric power supplied from the charge-discharge unit at the emergency stop. With this configuration, even when the industrial robot is equipped with the hand-driving motor, which rotates the hand, the industrial robot can make an emergency stop while maintaining the position of the hand in a fixed state with respect to the arm.

The industrial robot comprises a main body unit to which the base end of the arm is rotatably linked, a first arm unit which is rotatably linked to the main body unit with the base end thereof and a second arm unit which is rotatably linked to the front end of the first arm unit with the base end thereof and of which the hand is rotatably linked to the front end, a first motor for rotating the first arm unit with respect to the main body unit, a second motor for rotating the second arm unit with respect to the first arm unit, a first motor driver for driving the first motor and a second motor driver for driving the second motor.

It is preferred that the industrial robot be further equipped with an arm-elevating motor, an arm-elevating motor driver for driving the elevating motor, a first brake for stopping the arm-elevating motor and a second brake for stopping the arm-elevating motor with a braking force larger than the first brake, and that the control executing unit control the arm-elevating motor, the first brake and the second brake and activate the first brake and then activate the second brake to stop the arm-elevating motor. In this way, the arm-elevating motor can be stopped in a relatively short period of time by the first and second brakes. Therefore, even when the industrial robot with the uncontrollable arm-elevating motor needs to make an emergency stop, for example, the arm is prevented from dropping.

At that time, it is preferred that, in order to stop the arm-elevating motor in a shorter period of time, the second brake which has a large braking force is immediately activated at the time of an emergency stop. On the contrary, the immediate activation of the second brake which has a large braking force at the time of an emergency stop may stop the arm-elevating motor more suddenly than necessary, creating dangerous situation. Therefore, it is preferred that, when the second brake with a large braking force needs to be activated immediately at the time of an emergency stop, the control executing unit control the arm-elevating motor driver to rotate the arm-elevating motor in the direction to continue its rotation so that the arm-elevating motor will not make a more sudden stop than necessary. However, at that time, the electric power charged in the charge-discharge unit may be exhausted by the arm-elevating motor driver within a short period of time at the time of an emergency stop. If the electric power charged in the charge-discharge unit is exhausted by the arm-elevating motor driver within a short period of time at the time of an emergency halt, the control executing unit may not be able to control the motor driver by using the electric power which is to be supplied from the charge-discharge unit and therefore, the multiple arm units may rotate individually and involuntarily, causing an unexpected accident.

On the other hand, if the control executing unit first activates the first brake which has a small braking force to reduce the rotation speed of the arm-elevating motor and then activates the second brake which has a large braking force to stop the arm-elevating motor, the arm-elevating motor will not easily make a sudden stop; as a result, the electric power in the charge-discharge unit, which is consumed by the motor driver for arm-elevation, can be reduced at the time of an emergency stop. Therefore, with this configuration, the multiple motors are controlled by using the electric power supplied from the charge-discharge unit to have the industrial robot to make an emergency stop to have the position of the arm in a predetermined position.

Further, to achieve the above-mentioned objectives, the control method of industrial robot is a method of controlling an industrial robot which is equipped with an arm configured by relatively-rotatably linked multiple arm units, multiple motors for rotating the multiple arm units, multiple motor drivers for respectively driving the multiple motors and a power source for supplying electric power to the multiple motor drivers, wherein the power is turned off when the industrial robot makes an emergency stop and the multiple motors are stopped while the electric power supplied from the charge-discharge unit are used to control the multiple motor drivers.

In the industrial robot control method, the power source supplying electric power to the multiple motor drivers is turned off when the industrial robot makes an emergency stop. Therefore, the multiple motors can be stopped in a relatively short period of time at the time of an emergency halt of the industrial robot, ensuring safety in a relatively short period of time. Also, the electric power supplied from the charge-discharge unit which is chargeable with regenerative current generated by the multiple motors is used to control the motor drivers to stop the multiple motors when the industrial robot makes an emergency stoop. Therefore, according to the industrial robot control method, even when the industrial robot is equipped with the multiple motors for rotating the multiple arm units, the industrial robot can make an emergency stop to have the position of the arm in a predetermined state.

At least an embodiment of the industrial robot may include an arm configured by relatively-rotatably linked multiple arm units, multiple motors for rotating the multiple arm units, and a main body unit to which the base end of the arm is rotatably linked, the control unit for controlling the industrial robot is capable of switching the control of the industrial robot, based on the position and moving direction of the arm, between by a cylindrical coordinate system in which the center of rotation of the arm with respect to the main body unit is the original point and by a rectangular coordinate system in which the center of rotation of the arm is the original point.

In the industrial robot, the control unit switches the control of the industrial robot between in a cylindrical coordinate system having the center of rotation of the arm with respect to the main body unit as an original point and in a rectangular coordinate system having the center of rotation of the arm as an original point, based on the position and moving direction of the arm. Also, the control method of the industrial robot switches the control of the industrial robot between in a cylindrical coordinate system having the center of rotation of the arm with respect to the main body unit as an original point and in a rectangular coordinate system having the center of rotation of the arm as an original point, based on the position and moving direction of the arm. Therefore, the industrial robot is controlled in the cylindrical coordinate system when the front end of the arm moves in a straight line on an imaginary line passing the center of rotation of the arm with respect to the main body unit when viewed in the axial direction of rotation of the arm, and on the other hand, the industrial robot is controlled in the rectangular coordinate system when the front end of the arm moves in a straight line at the position not along the imaginary line passing the center of rotation of the arm with respect to the main body unit when viewed in the axial direction of rotation of the arm.

Therefore, when the front end of the arm moves in a straight line on an imaginary line passing the center of rotation of the arm when viewed in the axial direction of the rotation of the arm, the coordinates of a cylindrical coordinate system are used to teach the robot the moving position of the front end of the arm; when the front end of the arm moves in a straight line at the position not along the imaginary line passing the center of rotation of the arm when viewed in the axial direction of the rotation of the arm, the coordinates of a rectangular coordinate system are used to teach the robot the moving position of the front end of the arm. In other words, when the front end of the arm moves in a straight line at the position not along the imaginary line passing the center of rotation of the arm when viewed in the axial direction of the rotation of the arm, the moving position of the front end of the arm can be taught not by using the coordinates of a cylindrical coordinate system, but by using the coordinates of a rectangular coordinate system. Consequently, even when the front end of the arm moves in a straight line at the position not along the imaginary line passing the center of rotation of the arm when viewed in the axial direction of the rotation of the arm, the moving position of the front end of the arm can easily be taught to the robot.

The industrial robot is equipped with a hand which is rotatably linked to the front end of the arm, a hand-driving motor, a first arm unit which is rotatably linked to the main body unit with the base end thereof and a second arm unit which is rotatably linked to the front end of the first arm unit with the base end thereof and to which the hand is rotatably linked to the front end, as the arm; the control unit controls the industrial robot in a cylindrical coordinate system when the center of rotation of the hand with respect to the second arm unit moves in a straight line on the imaginary line passing the center of rotation of the arm when viewed in the top-bottom direction which is the axial direction of the rotation of the hand, the first arm unit and the second arm unit, and also controls the industrial robot in a rectangular coordinate system when the center of rotation of the hand moves in a straight line at the position not along the imaginary line when viewed in the top-bottom direction.

In this case, the coordinates by a cylindrical coordinate system is used to teach the moving position of the center of rotation of the hand when the center of rotation of the hand moves in a straight line on the imaginary line passing the center of rotation of the arm when viewed in the top-bottom direction; on the other hand, the coordinates by a rectangular coordinate system can be used to teach the robot the moving position of the center of rotation of the hand when the center of rotation of the hand moves in the straight line which is not along the imaginary line passing the center of rotation of the arm when viewed in the top-bottom direction. Thus, even when the center of rotation of the hand moves on the straight line which is not along the imaginary line passing the center of rotation of the arm when viewed in the top-bottom direction, the moving position of the center of rotation of the hand can easily be taught.

The control unit controls the industrial robot in a cylindrical coordinate system when the hand rotates with respect to the second arm unit while the first arm unit is not rotated with respect to the main body unit and the second arm unit is not rotated with respect to the first arm unit, for example. Also, the control unit controls the industrial robot in a cylindrical coordinate system when the first arm unit rotates with respect to the main body unit while the second arm unit is not rotated with respect to the first arm unit and the hand is not rotated with respect to the second arm unit.

As described above, in the industrial robot in which the inside of the arm which is arranged in vacuum is at least partially at atmospheric pressure, the hand and the arm-driving motor which are arranged in air inside the arm can efficiently be cooled down.

Next, as described above, according to the industrial robot original position returning method, the industrial robot which has stopped, having lost the coordinates of its current position, can be returned to the original position by a simple method. Also, according to the industrial robot, even if the industrial robot has stopped, having lost the coordinates of its current position, it can be returned to the original position by a simple method.

As described above, even when the industrial robot is equipped with multiple motors for rotating multiple arm units, the industrial robot can make an emergency stop while having the position of the arm in a predetermined state.

Further, as described above, even when the front end of the arm moves in the straight line which is not along the imaginary line passing the center of rotation of the arm with respect to the main body unit when viewed in the axial direction of rotation of the arm, the moving position of the front end of the arm can easily be taught to the robot. Furthermore, even when the front end of the arm moves in a straight line which is not along the imaginary line passing the center of rotation of the arm with respect to the main body unit when viewed in the axial direction of rotation of the arm, the moving position of the front end of the arm can easily be taught to the robot.

BRIEF DESCRIPTION OF DRAWING

Embodiments will now be described, by way of example only, with reference to the accompanying drawings which are meant to be exemplary, not limiting, and wherein like elements are numbered alike in several Figures, in which:

FIGS. 5(A)-5(C) Diagrams to explain the movement of the industrial robot when transferring a substrate from a process chamber shown in FIG. 1 to another process chamber.

FIG. 7(A)-7(C) Diagrams to explain the movement of the industrial robot for transferring a substrate into the process chamber shown in FIG. 1.

FIG. 8(A)-8(C) Diagrams to explain the movement of the industrial robot for transferring a substrate into the process chamber shown in FIG. 1.

DETAILED DESCRIPTION OF THE INVENTION

Figure 1:
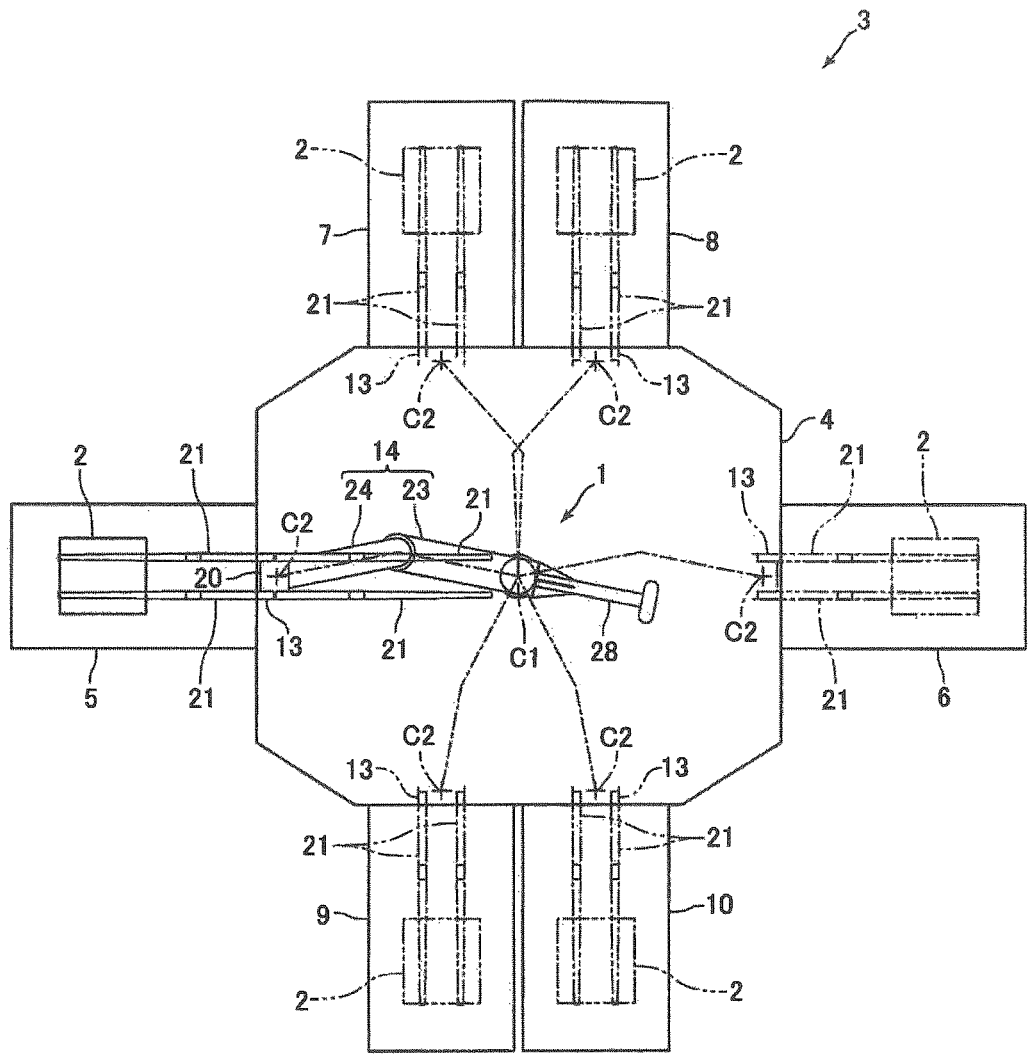
FIG. 1 A plan view of a state in which an industrial robot of an embodiment of the present invention is installed in an organic EL display manufacturing system.

Embodiments of the present invention are described hereinafter referring to the drawings.
(Configuration of Industrial Robot)
The embodiments are described here.

Figure 2A:
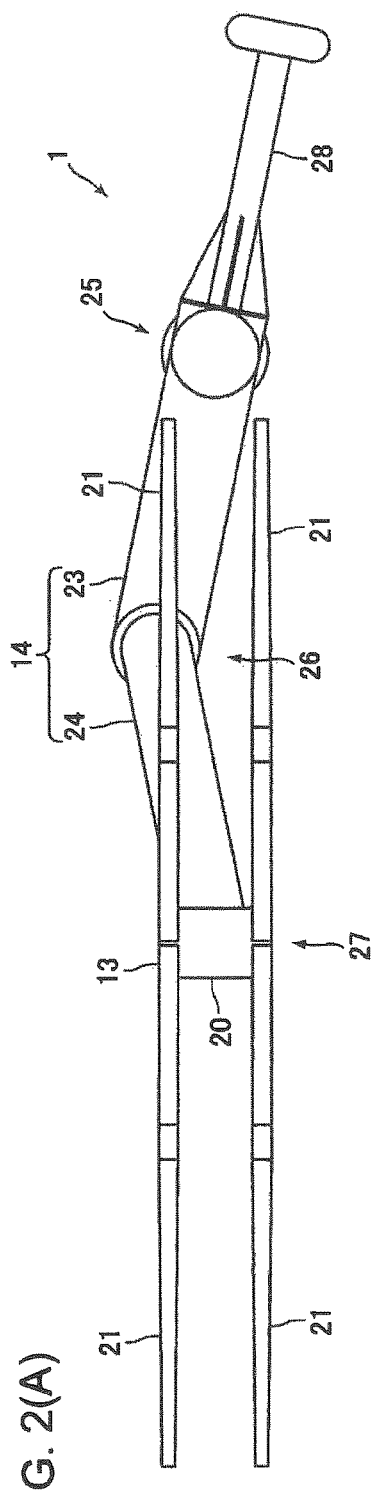
FIGS. 2(A)-2(B) A diagram of the industrial robot of FIG. 1: (A) is its plan view; (B) is its side view.
Figure 2B:
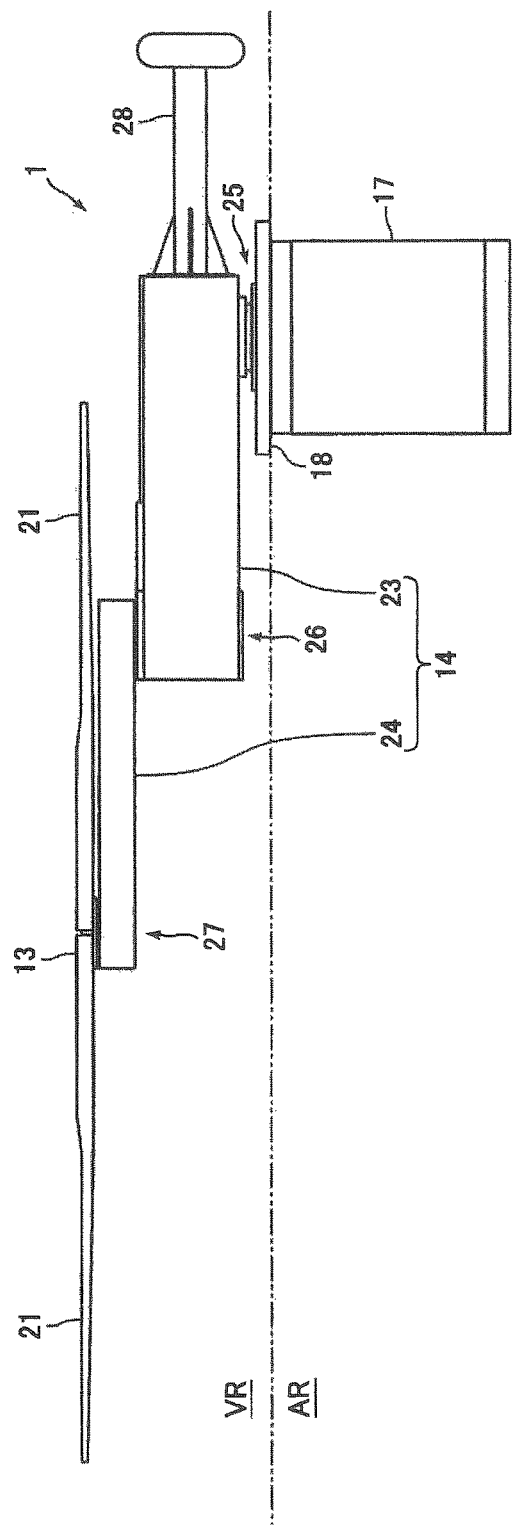
Figure 3:
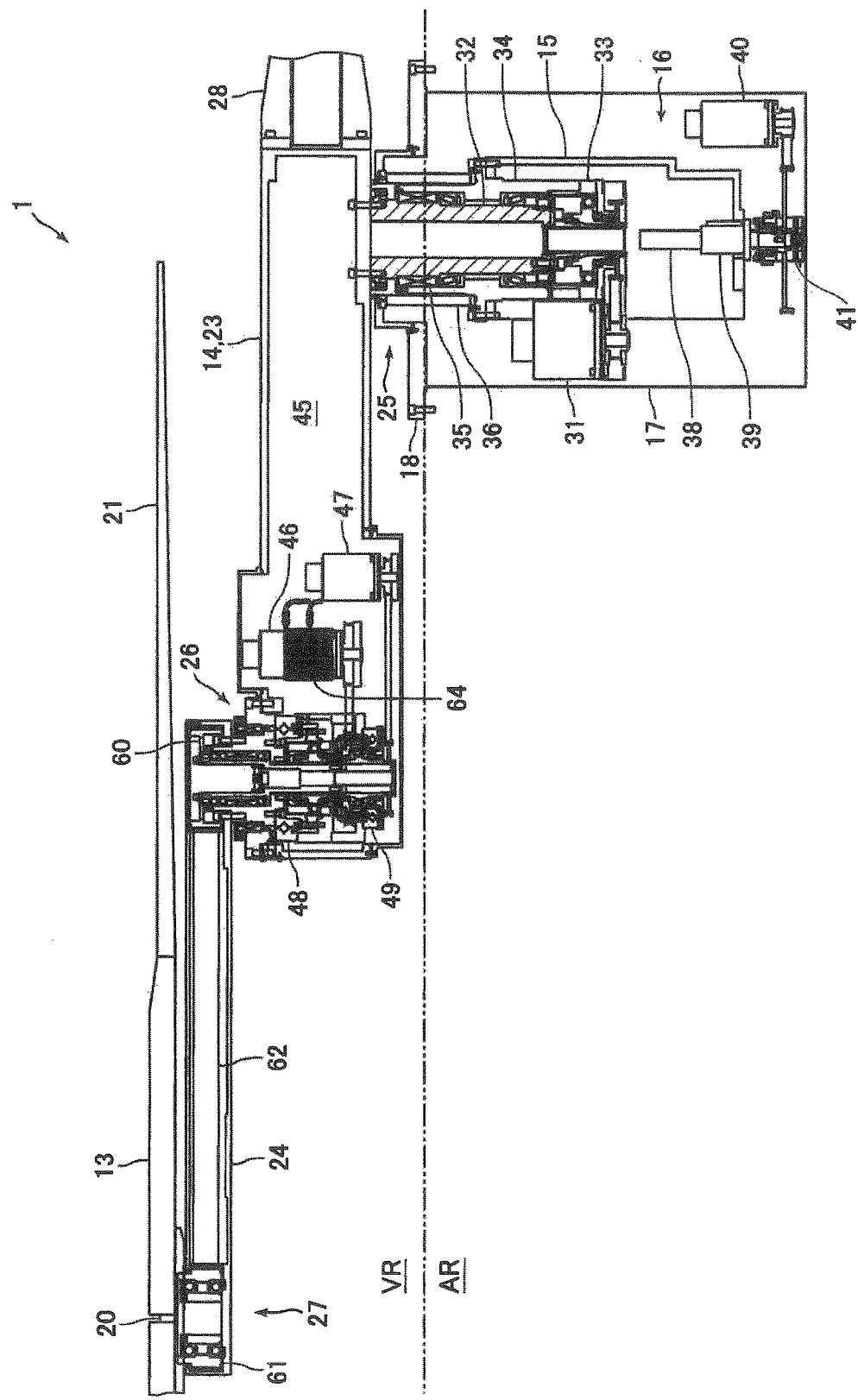
FIG. 3 A cross-sectional side view of the interior structure of the industrial robot of FIGS. 2(A)-2(B).
Figure 14:
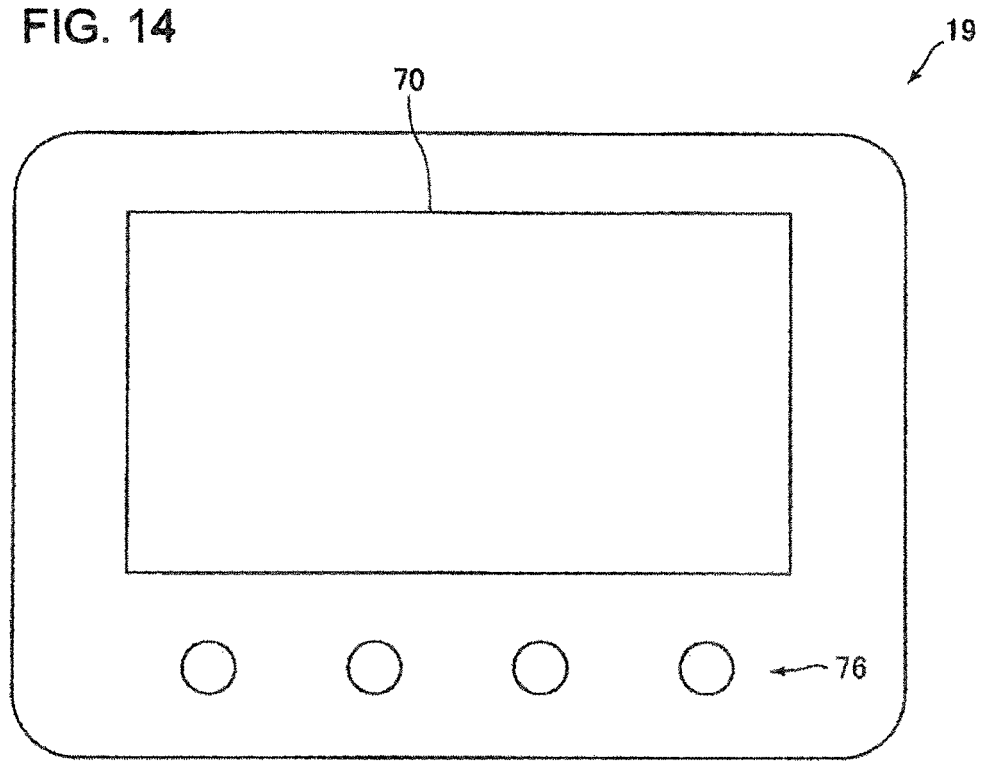
FIG. 14 A front view of a teaching operation terminal of the industrial robot shown in FIGS. 2(A)-2(B).
Figure 16:
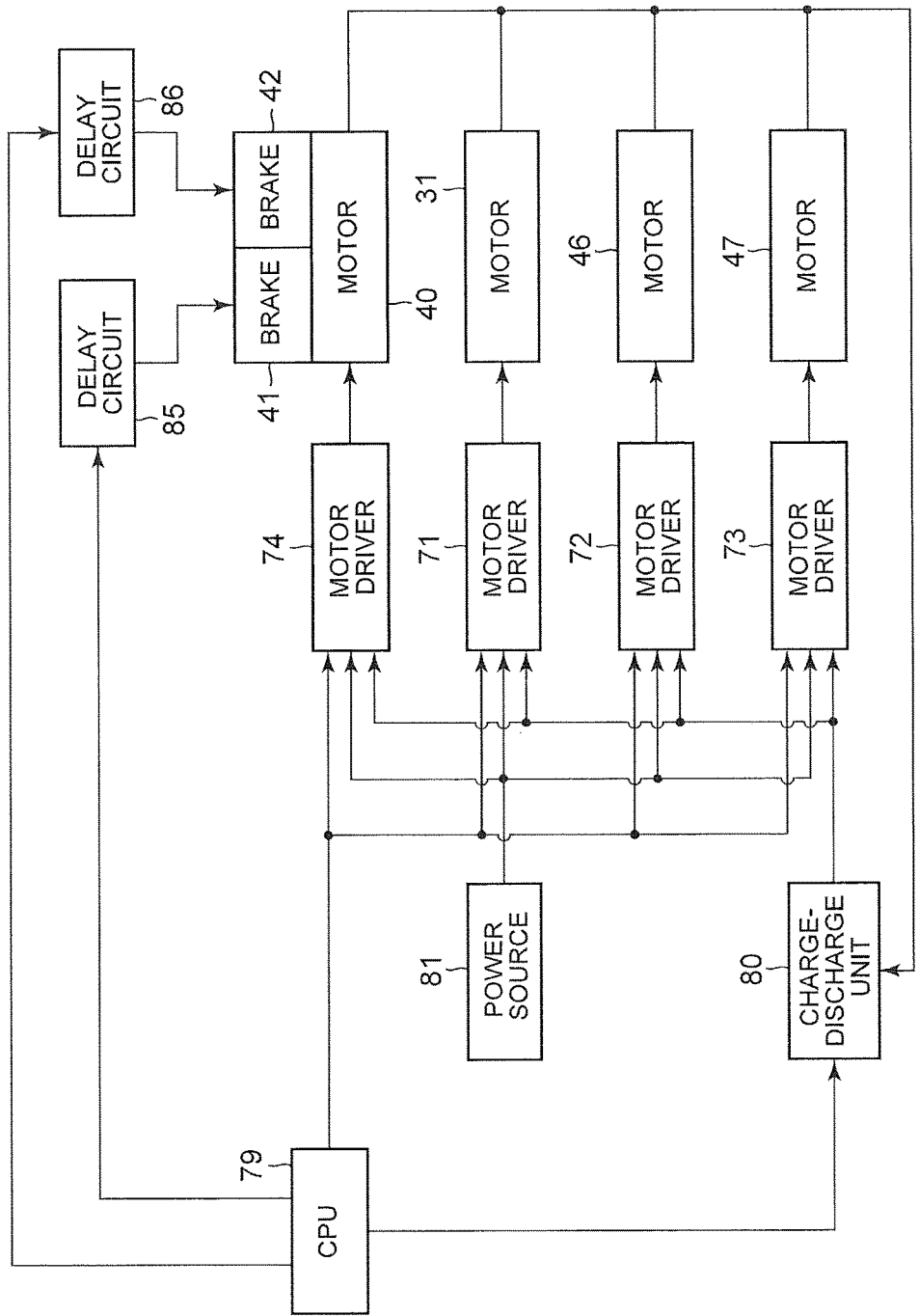
FIG. 16 A block diagram to explain the configuration of a control unit associated with a motor control of the industrial robot shown in FIGS. 2(A)-2(B).
Figure 17:
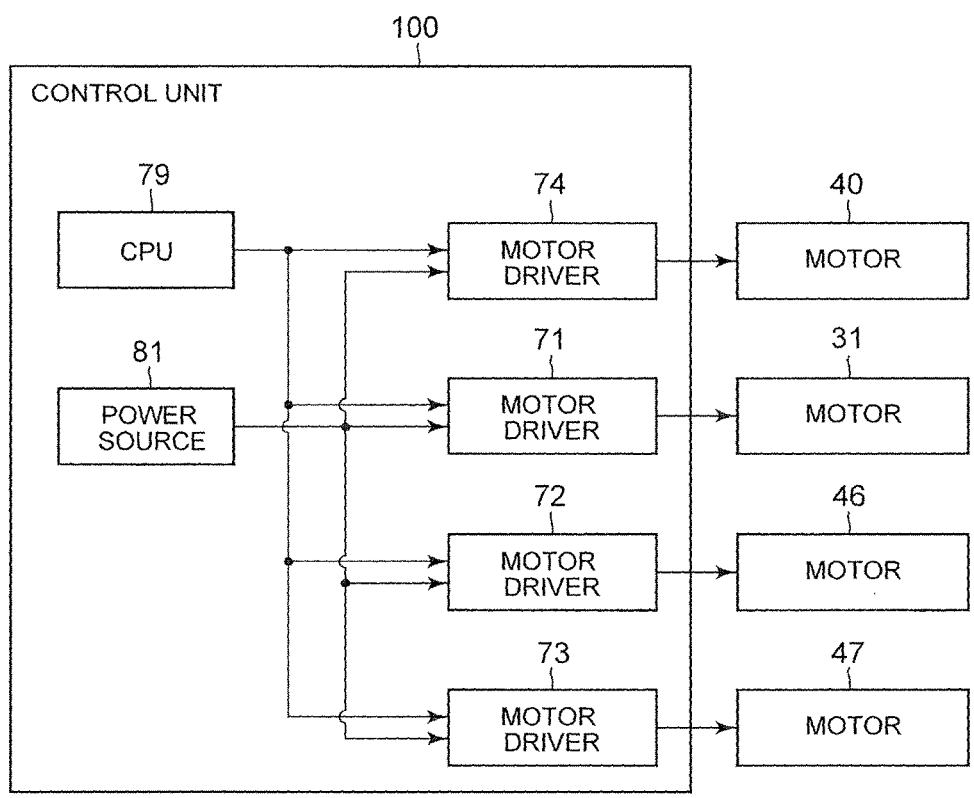
FIG. 17 Another block diagram to explain the configuration of the control unit associated with the motor control of the industrial robot shown in FIGS. 2(A)-2(B).

FIG. 1 is a plan view of a state in which an industrial robot 1 of the embodiment of the present invention is installed in an organic EL display manufacturing system 3. FIGS. 2(A)-2(B) are diagrams of the industrial robot 1 shown in FIG. 1: (A) is its plan view and (B) is its side view. FIG. 3 is a cross-sectional view to explain the interior structure of the industrial robot 1 shown in FIGS. 2(A)-2(B) from the side. FIG. 14 is an embodiment of the invention and shows a front view of a teaching operation terminal 19 of the industrial robot 1 shown in FIGS. 2(A)-2(B) FIG. 16 is an embodiment of the invention and shows a block diagram to explain the configuration of a control unit associated to the motor control of the industrial robot 1 shown in FIGS. 2(A)-2(B). FIG. 17 is an embodiment of the invention and shows another block diagram to explain the configuration of a control unit 100 associated to the motor control of the industrial robot 1 shown in FIGS. 2(A)-2(B).

The industrial robot 1 of this embodiment (hereinafter denoted as "robot 1") is a robot (a horizontal articulated robot) for transferring an organic EL (Organic Electroluminescence) display glass substrate 2 which is an object-to-be-handled. This robot 1 is suitable to handle a relatively large substrate 2. The robot 1, as shown in FIG. 1, is installed in the organic EL display manufacturing system 3 for use.

The manufacturing system 3 is provided with a transfer chamber 4 (hereinafter denoted as "chamber 4") which is placed in its center and multiple process chambers 5 through 10 (hereinafter denoted as "chambers 5 through 10") which are arranged to surround the chamber 4. The inside of the chamber 4 and the chambers 5 through 10 are in vacuum. Inside the chamber 4, part of the robot 1 is placed. Having a fork unit 21, which is a part of the robot 1 and described later, to enter any of the chambers 5 through 10, the robot 1 handles a substrate 2 among the chambers 5 through 10. In other words, the robot 1 handles the substrate 2 in vacuum. Various kinds of devices are placed in the chambers 5 through 10, in which the substrate 2 handled by the robot 1 is stored. In the chambers 5 through 10, also various kinds of processes are performed on the substrate 2. The chambers 5 through 10 of this embodiment are storage units in which substrates 2, the objects-to-be-handled, are stored. The configuration of the manufacturing system 3 is described in more detail later.

As shown in FIGS. 2(A)-2(B) and FIG. 3, the robot 1 is equipped with a hand 13 on which a substrate 2 is mounted, an arm 14 which the hand 13 is rotatably linked to the front end thereof, a main body unit 15 to which the base end of the arm 14 is rotatably linked, and an elevating mechanism 16 which elevates the main body unit 15. The main body unit 15 and the elevating mechanism 16 are housed inside a cylindrical casing body with bottom 17. A disc-shaped flange 18 is fixed on the top edge of the casing body 17. In the flange 18, a through hole is formed to place the top end portion of the main body unit 5 therein. Also, a portable teaching operation terminal (a teaching pendant) 19 (referring to FIG. 14) is connected to the robot 1 via a robot controller, which is not illustrated, to teach the robot 1 the position of the movement. Note that the illustration of the main body unit 15, the elevating mechanism 16 and the casing body 17 is omitted in FIG. 1, FIG. 2(A), etc.

The hand 13 and the arm 14 are arranged above the main body unit 15. The hand 13 and the arm 14 are also arranged above the flange 18. As described above, part of the robot 1 is arranged inside the chamber 4. More specifically, part of the robot 1 above the bottom end surface of the flange 18 is arranged inside the chamber 4. In other words, part of the robot 1 above the bottom end surface of the flange 18 is placed in a vacuum room VR, and therefore, the hand 13 and the arm 14 are arranged in vacuum. On the other hand, part of the robot 1 below the bottom end surface of the flange 18 are placed in an atmospheric room AR.

The hand 13 is configured by a base section 20 which is linked to the arm 14 and a fork with four prongs 21 on which a substrate 2 is mounted. The fork prongs 21 are formed in a straight line. Two of the four fork prongs 21 are arranged parallel at a predetermined distance from each other. The two fork prongs 21 are fixed to the base section 20 to project from the base section 20 to one side in the horizontal direction. The other two fork prongs 21 are fixed to the base section 20 to project from the base section 20 toward the opposite side in the horizontal direction in which the first two project.

The arm 14 is configured by a first arm unit 23 and a second arm unit 24. The first arm unit 23 and the second arm unit 24 are formed hollow. The base end of the first arm unit 23 is rotatably linked to the main body unit 15. To the front end of the first arm unit 23, the base end of the second arm unit 24 is rotatably linked. To the front end of the second arm unit 24, the hand 13 is rotatably linked. A connection between the arm 14 and the main body unit 15 (i.e., a connection between the first arm unit 24 and the main body unit 13) is made as a joint section 25. A connection between the first arm unit 23 and the second arm unit is made a joint section 26. A connection between the arm 14 and the hand 13 (i.e., a connection between the second arm unit 24 and the hand 13) is made as a joint section 27. The distance between the center of rotation of the second arm unit 23 with respect to the first arm unit 23 and the center of rotation of the first arm unit 23 with respect to the main body unit 15 is equal to the distance between the center of rotation of the second arm unit 24 with respect to the first arm unit 23 and the center of rotation of the hand 13 with respect to the second arm unit 24. In this embodiment, the joint section 26 is a first joint connecting the first arm unit 23 and the second arm unit 24; the joint section 27 is a second joint connecting the second arm unit 24 and the hand 13.

The first arm unit 23 is attached to the main body unit 15 extending from the main body unit 15 to one side in the horizontal direction. A counterweight 28, which extends from the main body unit 15 in the direction opposite the direction the first arm unit 23 extends (i.e., to the other side in the horizontal direction), is attached to the first arm unit 23. The second arm unit 24 is arranged above the first arm unit 23. Also, the hand 13 is arranged above the second arm unit 24.

A motor 31 is mounted in the main body unit 15 to rotate the first arm unit 23 with respect to the main body unit 15. The main body unit 15 is also equipped with a hollow rotating shaft 32 to which the base end of the first arm unit 23 is fixed, a reduction gear 33 which reduces the rotation of the motor 31 and transmits it to the first arm unit 23 and a cylindrical holding member 34 which holds the casing body of the reduction gear 33 and also rotatably holds the hollow rotating shaft 32.

Note that the motor 31 is mounted in the main body unit 15 as an arm-driving motor to rotate the first arm unit 23 with respect to the main body unit 15 in the embodiment of the invention.

In the embodiment of the invention, a motor 31 is also mounted in the main body unit 15 as an arm-driving motor to rotate the first arm unit 23 with respect to the main body unit 15.

The reduction gear 33 is a hollow reduction gear having a through hole formed in the center thereof in the radial direction. The reduction gear 33 is arranged such that the axial center of the through hole agrees with the axial center of the hollow rotating shaft 32. The motor 31 is connected to the input side of the reduction gear 33 via a pulley and a belt. The bottom end of the hollow rotating shaft 32 is fixed to the output side of the reduction gear 33. On the top end of the hollow rotating shaft 32, the bottom surface of the base end of the first arm unit 23 fixed. The hollow rotating shaft 32 is arranged on the inner circumferential side of the holding member 34, and a bearing is arranged between the outer circumferential surface of the hollow rotating shaft 32 and the inner circumferential surface of the holding member 34. With the motor 31 rotated, the power of the motor 31 is transmitted to the base end of the first arm unit 23 and consequently the first arm unit 23 is rotated.

A magnetic fluid seal 35 is arranged in the joint section 25 to prevent air from entering the vacuum room VR. The magnetic fluid seal 35 is arranged between the outer circumferential surface of the hollow rotating shaft 32 and the inner circumferential surface of the holding member 34. Also, a bellows 36 is arranged in the joint section 25 to prevent air from entering the vacuum room VR. More specifically, the bellows 36 is arranged on the outer circumferential side of the magnetic fluid seal 35 and on the outer circumferential side of the holding member 34. The bottom end of the bellows 36 is fixed to the holding member 34 and the top end of the bellows 36 is fixed to the flange 18. The bellows 36 is outstretched when a motor 40 configuring part of the elevating mechanism 16, which is described later, is rotated and the main body unit 15 is elevated.

The elevating mechanism 16 is provided with a screw member 38 arranged having the top-bottom direction as its axial direction, a nut member 39 which engages with the screw member 38, and the motor 40 which rotates the screw member 38. The screw member 38 is rotatably mounted near the bottom of the casing body 17. The motor 40 is also mounted on the bottom side of the casing body 17. The screw member 38 is connected to the motor 40 via a pulley and a belt. The nut member 39 is mounted to the main body unit 15 via a predetermined bracket. In this embodiment, as the motor 40 rotates, the screw member 38 is rotated and then the main body unit 15 is elevated together with the nut member 39. Note that the elevating mechanism 16 is provided with a guide shaft for guiding the main body unit 15 in the up-down direction and a guide block which engages with the guide shaft to slide in the up-down direction.

The embodiment of the invention is described hereinafter.

The elevating mechanism 16 is provided with the screw member 38 arranged having the top-bottom direction as its axial direction, the nut member 39 which engages with the screw member 38, the motor 40 for rotating the screw member 38, a brake 41 as the first brake to stop the motor 40 and a brake 42 as the second brake to stop the motor 40 (referring to FIG. 16).

The screw member 38 is rotatably mounted on the bottom side in the casing unit 14. The motor 40 is mounted on the bottom side in the casing unit 17. The screw member 38 is connected to the motor 40 via the pulley and the belt. The nut member 39 is mounted to the main body unit 15 via a predetermined bracket. In this embodiment, as the motor 40 rotates, the screw member 38 is rotated and then the main body unit 15 is elevated together with the nut member 39. In other words, as the motor 40 turns, the hand 13 and the arm 14 are elevated together with the main body unit 15. The motor 40 of this embodiment is a motor for elevating the arm 14. Note that the elevating mechanism 16 is provided with the guide shaft which guides the main body unit in the up-down direction and a guide block which engages with the guide shaft to slide in the up-down direction.

The brake 41 is mounted below the bottom end of the screw member 38. The brake 42 is built in the motor 40. The brake 41 and 42, so-called non-excited actuation type brakes, are respectively provided with a casing unit in which a coil is stored, a side plate which is fixed to the casing unit, an armature which is arranged movable in the axial direction with respect to the casing unit, a brake disk arranged between the side plate and the armature, and a compress coil spring energizing the armature toward the brake disk. In the brake 41, the brake disk is attached to the screw member 38; in the brake 42, the plate disk is attached to the rotating shaft of the motor 40.

In the brake 41, 42, the armature is attracted to the casing unit when the coil is electrified, and then the brake disk is released. Also, when the electrification of the coil is stopped, the brake disk in the brake 41, 42 becomes interposed between the armature and the side plate due to the energizing force of the compression coil spring, and then the motor 40 is put on brake. In this embodiment, the braking force of the brake 42 is larger than that of the brake 41.

As shown in FIG. 16, the control unit of the robot 1 is provided with a motor driver 71 as a first motor driver to drive-control the motor 31, a motor driver 72 as a second motor driver to drive-control the motor 46, a motor driver 73 as a hand-driving motor driver to drive-control the motor 47 and a motor driver 74 as an elevation-driving motor driver to drive-control the motor 40. The control unit of the robot 1 is also provided with a delay circuit 85 that adjusts the operation timing of the brake 41 and a delay circuit 86 that adjusts the operation timing of the brake 42.

The control unit of the robot 1 is further provided with a power source 81 for supplying electric power to the motor drivers 71 through 74, a CPU (Central Processing Unit) 79 as a control executing unit to control the motor drivers 71 through 74, and a charge-discharge unit 80 that is connected to the motors 31, 40, 46 and 47. The CPU 79 also controls the brake 41, 42 via the delay circuit 85, 86. The charge-discharge unit 80 has a relay, a diode and a condenser which are not illustrated. The charge-discharge unit 80 is chargeable with regenerative current generated by the motors 31, 40, 46 and 47. More specifically, when the condenser of the charge-discharge unit 80 is electrified with regenerative current generated by the motor 31, 40, 46 and 47, the condenser can be charged.

In the embodiment of the invention, the teaching operation terminal 19 is provided with a display 70 to display various kinds of information and an operation button 76 to perform various kinds of operations. At the teaching operation terminal 19 of this embodiment, a jogging operation can be performed so that the robot 1 can move while an operator is pressing down the operation button 71 while the robot 1 stops moving when the operator stops pressing down the operation button 71 (i.e., when the operation of the button 76 is stopped).

Note that, in the embodiment of the invention, the control unit 100 to control the robot 1, as shown FIG. 17, is provided with the motor driver 71 to drive-control the motor 31, the motor driver 72 to drive-control the motor 46, the motor driver 73 to drive-control the motor 47, and the motor driver 74 to drive-control the motor 40. The control unit 70 is also provided with the power source 81 for supplying electric power to the motor drivers 71 through 74 and the CPU 79 for controlling the motor drivers 71 through 74.

(Interior Configuration of First Arm Unit and Configuration of Joint)

Figure 4:
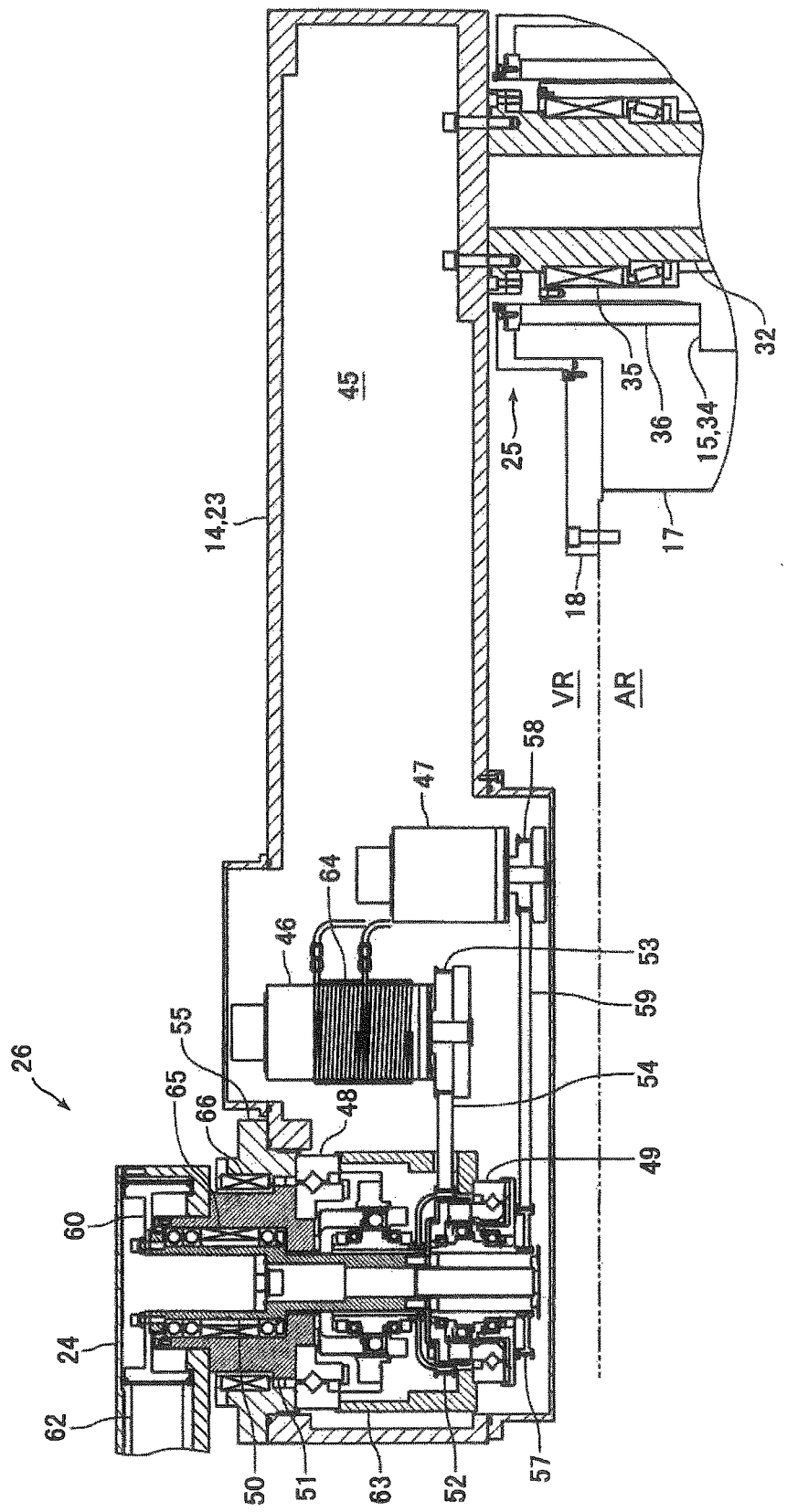
FIG. 4 A blowup of a first arm unit and a joint section shown in FIG. 3.

FIG. 4 is a blowup of the first arm unit 23 and the joint 26 shown in FIG. 3.

As described above, the first arm unit 23 and the second arm unit 24 are formed hollow. In the interior space 45 of the hollow first arm unit 23 are the motor 46 as the first motor for rotating the second arm unit 24 with respect to the first arm unit 23 and the motor 47 as the second motor for rotating the hand 13 with respect to the second arm unit 24. The joint section 26 is provided with the reduction gear 48 as the first reduction gear for reducing the rotation of the motor 46 and transmitting it to the second arm unit 24 and the reduction gear 49 as the second reduction gear for reducing the rotation of the motor 47 and transmitting it to the hand 13. The reduction gear 48, 49 is a hollow reduction gear having a through hole in the center thereof in the radial direction. The joint section 26 is also provided with a hollow rotating shaft 50 and a hollow rotating shaft 51 which is arranged on the outer circumference of the hollow rotating shaft 50 and coaxially with the rotating shaft 50.

According to the embodiment of the invention, arranged in the interior space 45 of the hollow first arm unit 23 are the motor 46 as the arm-driving motor for rotating the second arm unit with respect to the first arm unit 23 and the motor 47 as the hand-driving motor for rotating the hand 13 with respect to the second arm unit 24.

Note that, in the embodiment of the invention, arranged in the interior space 45 of the hollow first arm unit 23 are the motor 46 as the second motor for rotating the second arm unit 24 with respect to the first arm unit 23 and the motor 47 as the hand-driving motor for rotating the hand 13 with respect to the second arm unit 24.

Note that, in the embodiment of the invention, arranged in the interior space 45 of the hollow first arm unit 23 are the motor 46 for rotating the second arm unit 24 with respect to the first arm unit 23 and the motor 47 as the hand-driving motor for rotating the hand 13 with respect to the second arm unit 24.

The motor 46 is connected to the input side of the reduction gear 48 via the pulleys 52 and 53 and the belt 54. The bottom end of the hollow rotating shaft 51 is fixed to the output side of the reduction gear 48. The top end of the hollow rotating shaft 51 is fixed to the bottom surface of the base end of the second arm unit 24. The casing body of the reduction gear 48 is fixed to the cylindrical holding member 55. The holding member 55 is fixed to the first arm unit 23. The holding member 55 is also positioned on the outer circumference of the hollow rotating shaft 51. As the motor 46 rotates, the power of the motor 46 is transmitted to the base end of the second arm unit 24 via the pulleys 52, 53, the belt 54 and the reduction gear 48, and then the second arm unit 24 is rotated.

The motor 47 is connected to the input side of the reduction gear 49 via the pulleys 57 and 58 and the belt 59.

The bottom end of the hollow rotating shaft 50 is fixed to the output side of the reduction gear 49. On the top end of the hollow rotating shaft 50, a pulley 60 is fixed. The pulley 60 is positioned inside of the base end of the hollow second arm unit 24. As shown in FIG. 3, a pulley 61 is arranged inside of the front end of the second arm unit 24. The pulley 61 is rotatably held at the front end of the second arm unit 24. On the top end face of the pulley 61, the bottom surface of the base section 20 of the hand 13 is fixed. A belt 62 is bridged over the pulleys 60 and 61. The casing body of the reduction gear 49 is fixed to the cylindrical holding member 63. The holding member 63 is fixed to the first arm unit 23. As the motor 47 rotates, the power of the motor 47 is transmitted to the base section 20 of the hand 13 via the pulleys 57, 58, the belt 59, the reduction gear 49, the pulleys 60, 61 and the belt 62, and then the hand 13 is rotated.

The reduction gear 48 and the reduction gear 49 are arranged coaxially on top of the other so that the axial center of the through holes coincides with the axial center of the hollow rotating shaft 51. In other words, the reduction gear 48 and the reduction 49 are arranged coaxially on top of the other so that the axial centers thereof coincide with the center of rotation of the second arm unit 24 with respect to the first arm unit 23. In this embodiment, the reduction gear 48 is positioned above the reduction gear 49.

The interior space 45 of the first arm unit 23 is sealed and the pressure in the interior space 45 is at atmospheric pressure. As described above, the motors 46, 47 are arranged in the interior space 45. The reduction gears 48, 49 are arranged in the interior space 45 at the front end of the first arm unit 23. In other words, the motors 46, 47 and the reduction gears 48, 49 are arranged in air. A cooling pipe 64 is wound around the motor 46 to cool down the motor 46. Compressed air can be supplied to the cooling pipe 64, and the motor 46 is cooled down by the compressed air passing through the inside of the cooling pipe 64. Note that, since the heat generation by the motor 47 is small compared to the heat generation by the motor 46 in this embodiment, a cooling pipe is not wound around the motor 47.

A magnetic fluid seal 65, 66 is arranged at the joint section 26 to ensure the interior space 45 is airtight. In other words, the magnetic fluid seal 65, 66 is arranged at the joint section 26 to prevent air from entering the vacuum room VR from the interior space 45. The magnetic fluid seal 65 is arranged between the outer circumferential surface of the hollow rotating shaft 50 and the inner circumferential surface of the hollow rotating shaft 51 while the magnetic fluid seal 66 is arranged between the outer circumferential surface of the hollow rotating shaft 51 and the inner circumferential surface of the holding member 55. Note that a bearing is arranged between the outer circumferential surface of the hollow rotating shaft 50 and the inner circumferential surface of the hollow rotating shaft 51. Also, in this embodiment, the interior space of the second arm unit 24 is kept in vacuum.

(Configuration of Manufacturing System)

As described above, the manufacturing system 3 has multiple chambers 5 through 10 which are arranged to surround the chamber 4. In the manufacturing system 3 of this embodiment, six chambers 5 through 10 are arranged to surround the chamber 4. In FIG. 1, three directions intersecting perpendicularly with each other are assigned to X direction, Y direction and Z direction hereinafter. The robot 1 is positioned having the top-bottom direction thereof to agree with Z direction. Therefore, Z direction is set to the top-bottom direction. Also, X1 direction is the "right" side, X2 direction is the "left" side, Y1 direction is the "front" side and the Y2 direction is the "rear" side.

The chamber 4 is formed to be in an octagon shape when viewed in the top-bottom direction. The chambers 5 through 10 are formed to be in a rectangular shape when viewed in the top-bottom direction, and arranged such that the side faces thereof are parallel to the YZ plane created in the Y direction and the Z direction or the ZX plane created in the Z direction and the X direction. The chamber 5 is arranged so as to be connected to the left end of the chamber 4; the chamber 6 is arranged so as to be connected to the right end of the chamber 4. The chambers 7 and 8 are arranged so as to be connected to the rear end of the chamber 4. The chamber 7 and chamber 8 are adjacent to each other in the left-right direction. In this embodiment, the chamber 7 is positioned on the left side while the chamber 8 is positioned on the right. Further, the chambers 9 and 10 are arranged so as to be connected to the front end of the chamber 4. The chambers 9 and 10 are adjacent to each other in the left-right direction. In this embodiment, the chamber 9 is positioned on the left side and the chamber 10 on the right.

The chambers 5 and 6 are arranged such that an imaginary line along the left-right direction passing through the center of rotation C1 of the first arm unit 23 with respect to the main body unit 15 passes through the mid positions of the chambers 5 and 6 in the front-rear direction. The chambers 7 and 8 are arranged such that an imaginary line along the front-rear direction passing through the center of rotation C1 passes though the mid position between the chambers 7 and 8 in the left-right direction. In other words, the middle position between the chambers 7 and 8 in the left-right direction is off-set with respect to the center of rotation C1. In the same manner, the chambers 9 and 10 are arranged such that an imaginary line along the front-rear direction passing the center of rotation C1 passes through the mid position between the chambers 9 and 10 in the left-right direction. In other words, the middle position between the chambers 9 and 10 in the left-right direction is offset with respect to the center of rotation C1. Also, the chamber 7 and the chamber 9 are arranged in the same position in terms of the left-right direction while the chamber 8 and the chamber 10 are arranged in the same position.

(Movement of Industrial Robot)

Figure 6A:
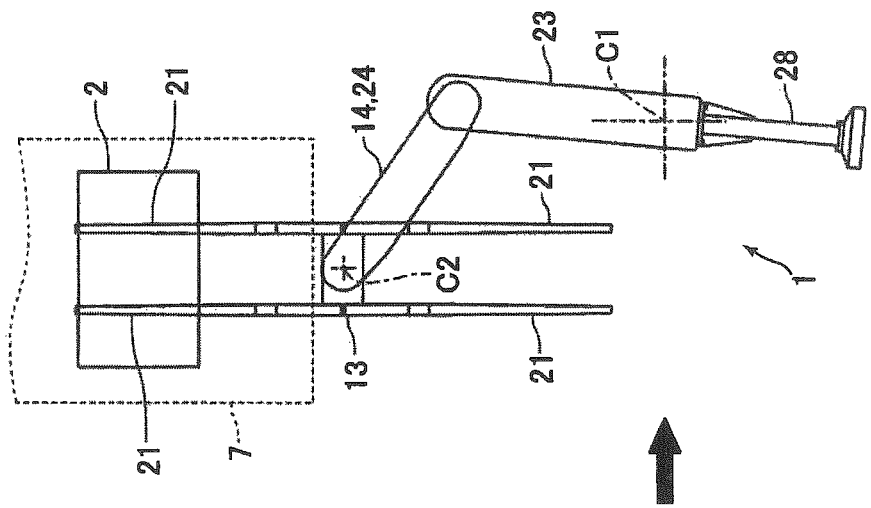
FIGS. 6(A)-6(C) Diagrams to explain the movement of the industrial robot for transferring a substrate into the process chamber shown in FIG. 1.
Figure 6B:
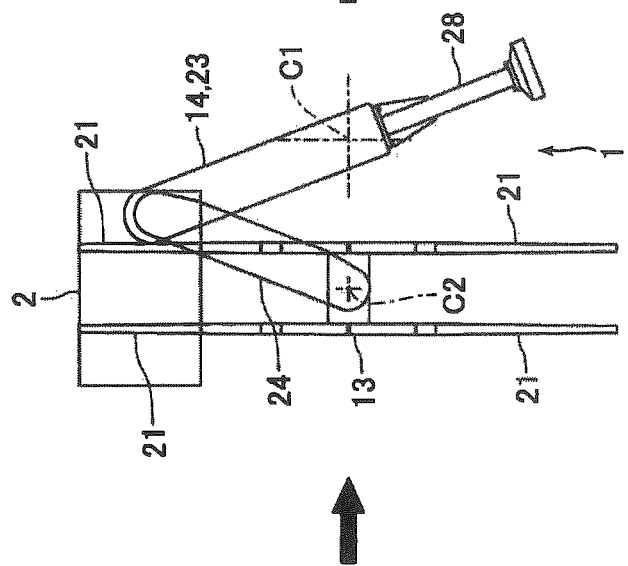
Figure 6C:
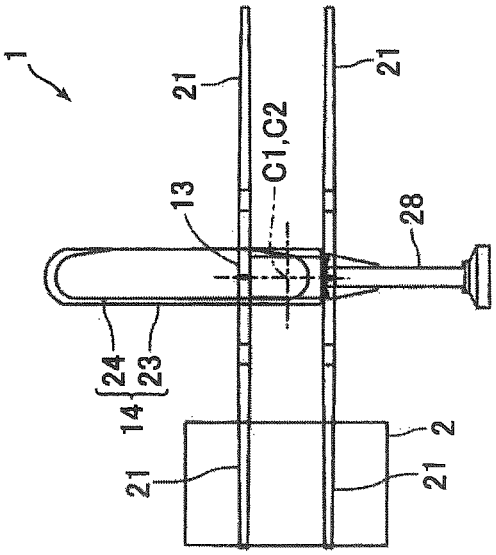
Figure 9C:
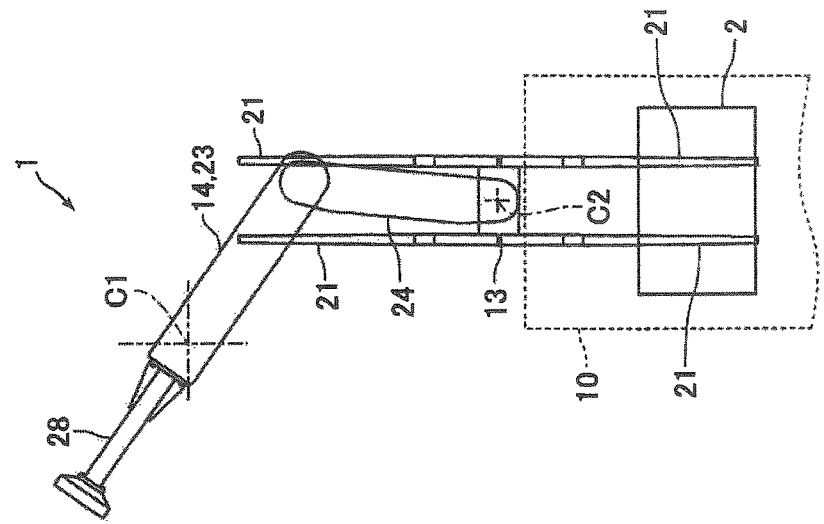
FIG. 9(A)-9(C) Diagrams to explain the movement of the industrial robot for transferring a substrate into the process chamber shown in FIG. 1.
Figure 9B:
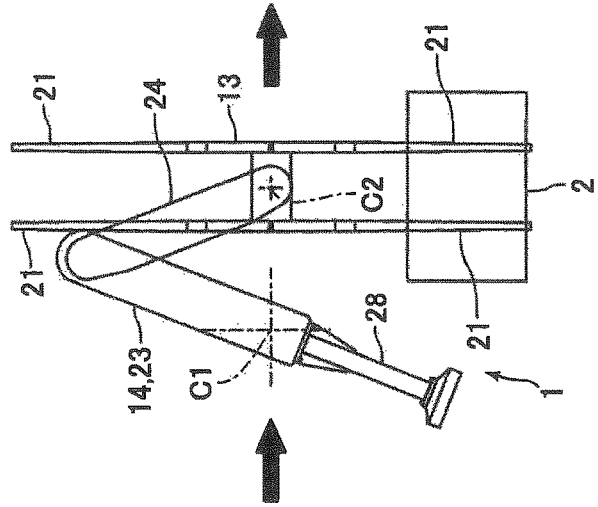
Figure 9A:
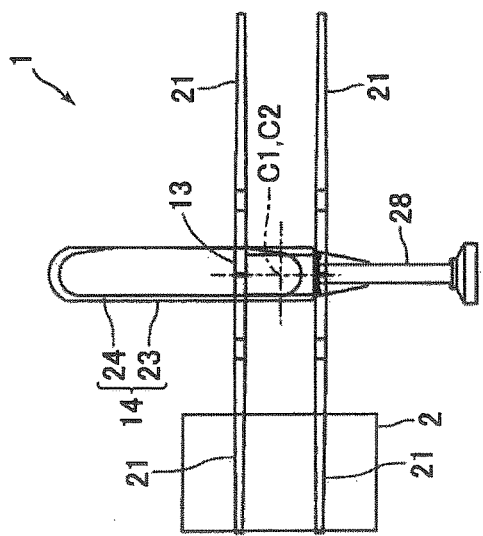

FIGS. 5(A)-5(C) are diagrams to explain the movement of the industrial robot 1 for transferring a substrate 2 from the process chamber 5 shown in FIG. 1 to the process chamber 6. FIGS. 6(A)-6(C) are diagrams to explain the movement of the industrial robot 1 for transferring the substrate 2 to the process chamber 7 shown in FIG. 1. FIG. 7(A)-7(C) is a diagram to explain the movement of the industrial robot 1 for taking the substrate 2 into the process chamber 9 shown in FIG. 1. FIGS. 8(A)-8(C) are diagrams to explain the movement of the industrial robot 1 for taking the substrate 2 into the process chamber 8 shown in FIG. 1. FIGS. 9(A)-9(C) are diagrams to explain the movement of the industrial robot 1 for taking the substrate 2 into the process chamber 10 shown in FIG. 1.

With the motors 31, 40, 46 and 47 driven, the robot 1 handles a substrate 2 between the chambers 5 through 10. As shown in FIGS. 5(A)-5(C) for example, the robot 1 transfers the substrate 2 from the chamber 5 into the chamber 6. In other words, keeping the fork prongs 21 parallel to the left-right direction, as shown in FIG. 5(A), the robot 1 outstretches the arm 14 and mounts the substrate 2 inside the chamber 5, and then, as shown in FIG. 5(B), folds the arm 14 in until the first arm unit 23 and the second arm unit 24 come to overlap with each other in the top-bottom direction, to take the substrate 5 out of the chamber 5. Then, the robot 1 rotates the hand 13 at 180 degrees, outstretches the arm 14 and takes the substrate 2 into the chamber 6, as shown in FIG. 5 (C). When the robot 1 transfers the substrate 2 from the chamber 5 to the chamber 6, the center of rotation C2 of the hand 13 with respect to the second arm unit 24 moves in a straight line on an imaginary line parallel to the left-right direction passing through the center of rotation C1 when viewed in the top-bottom direction. In other words, the hand 13 moves in a straight line to the right when viewed in the top-bottom direction when taking the substrate 2 out of the chamber 5 and bringing the substrate 2 into the chamber 6.

Also, the robot 1 takes the substrate 2, which has been taken out of the chamber 5, into the chamber 7 (referring to FIGS. 6(A)-6(C), for instance. In this case, the motors 31, 46, and 47 are driven while the arm 14 is folded in as shown in FIG. 6(A), and the robot 1 rotates the hand 13, the first arm unit 23 and the second arm unit 24 so that the fork prongs 21 become parallel to the front-rear direction and the substrate 2 is positioned on the rear end side of the hand 13 and also the center of rotation C2 of the hand 13 with respect to the second arm unit in the left-right direction agrees with the center of the chamber 7 in the left-right direction, as shown in FIG. 6(B). At that time, the center of rotation C2 moves in a straight line on the imaginary line parallel to the left-right direction passing through the center of rotation C1 when viewed in the top-bottom direction. Then, the robot 1 outstretches the arm 14 and takes the substrate 2 into the chamber 7 as shown in FIG. 6(C). At that time, the center of rotation C2 moves in a straight line on the imaginary line parallel to the front-rear direction passing through the center of the chamber 7 in the left-right direction when viewed in the top-bottom direction. In other words, the center of rotation C2 moves in a straight line in the position not along the imaginary line passing through the center of rotation C1 (in the position off the imaginary line passing through the center of rotation C1) when viewed in the top-bottom direction.

In the same manner, the robot 1 takes a substrate 2 taken out from the chamber 5 into the chamber 9 (referring to FIGS. 7(A)-7(C). In this case, the motors 31, 46, and 47 are driven while the arm 14 is folded in as shown in FIG. 7(A), and the robot 1 rotates the hand 13, the first arm unit 23 and the second arm unit 24 so that the fork prongs 21 become parallel to the front-rear direction and the substrate 2 is positioned on the front end side of the hand 13 and also the center of rotation C2 and the center of the chamber 9 in the left-right direction agree with each other in the left-right direction, as shown in FIG. 7(B). At that time, the center of rotation C2 moves in a straight line on the imaginary line parallel to the left-right direction passing through the center of rotation C1 when viewed in the top-bottom direction. Then, the robot 1 outstretches the arm 14 and takes the substrate 2 into the chamber 9 as shown in FIG. 7(C). At that time, the center of rotation C2 moves in a straight line on the imaginary line parallel to the front-rear direction passing through the center of the chamber 9 in the left-right direction when viewed in the top-bottom direction. In other words, the center of rotation C2 moves in a straight line at the position not along the imaginary line passing through the center of rotation C1 when viewed in the top-bottom direction.

Also, the robot 1 takes a substrate 2 taken out from the chamber 5 into the chamber 8 (referring to FIGS. 8(A)-8(C), for instance. In this case, the motors 31, 46, and 47 are driven while the arm 14 is folded in as shown in FIG. 8(A), and the robot 1 rotates the hand 13, the first arm unit 23 and the second arm unit 24 so that the fork prongs 21 become parallel to the front-rear direction and the substrate 2 is positioned on the rear end side of the hand 13 and also the center of rotation C2 and the center of the chamber 9 in the left-right direction agree with each other in the left-right direction, as shown in FIG. 8(B). At that time, the center of rotation C2 moves in a straight line on the imaginary line parallel to the left-right direction passing through the center of rotation C1 when viewed in the top-bottom direction. Then, the robot 1 outstretches the arm 14 and takes the substrate 2 into the chamber 8 as shown in FIG. 8(C). At that time, the center of rotation C2 moves in a straight line on the imaginary line parallel to the front-rear direction passing through the center of the chamber 9 in the left-right direction when viewed in the top-bottom direction. In other words, the center of rotation C2 moves in a straight line at the position not along the imaginary line passing through the center of rotation C1 when viewed in the top-bottom direction.

Further, the robot 1 takes a substrate 2 taken out from the chamber 5 into the chamber 10 (referring to FIGS. 9(A)-(9C), for instance. In this case, the motors 31, 46, and 47 are driven while the arm 14 is folded in as shown in FIG. 9(A), and the robot 1 rotates the hand 13, the first arm unit 23 and the second arm unit 24 so that the fork prongs 21 become parallel to the front-rear direction and the substrate 2 is positioned on the front end side of the hand 13 and also the center of rotation C2 and the center of the chamber 10 in the left-right direction agree with each other in the left-right direction, as shown in FIG. 9(B). At that time, the center of rotation C2 moves in a straight line on the imaginary line parallel to the left-right direction passing through the center of rotation C1 when viewed in the top-bottom direction. Then, the robot 1 outstretches the arm 14 and takes the substrate 2 into the chamber 10 as shown in FIG. 9(C). At that time, the center of rotation C2 moves in a straight line on the imaginary line parallel to the front-rear direction passing through the center of the chamber 10 in the left-right direction when viewed in the top-bottom direction. In other words, the center of rotation C2 moves in a straight line at the position not along the imaginary line, which passes through the center of rotation C1, when viewed in the top-bottom direction.

At the time of taking the substrate 2 out or in, the hand 13 and the first arm unit 23 rotate such that the angle of rotation of the first arm unit 23 with respect to the main body unit 15 is equal to the angle of rotation of the hand 13 with respect to the second arm unit 24 and the direction of rotation of the first arm unit 23 with respect to the main body unit 15 is opposite the direction of rotation of the hand 13 with respect to the second arm unit 24. In other words, the motors 31 and 47 are rotated such that the angle of rotation of the first arm unit 23 with respect to the main body unit 15 is equal to the angle of rotation of the hand 13 with respect to the second arm unit 24 and the direction of rotation of the first arm unit 23 with respect to the main body unit 15 is opposite that of the hand 13 with respect to the second arm unit 24. Therefore, the direction of the hand 13 can be kept constant at the time of taking the substrate 2 out and in. In other words, the direction of the hand 13 is maintained to have the fork prongs 21 parallel to the left-right direction when the substrate 2 is transferred with respect to the chamber 5 and 6; the direction of the hand 13 is maintained to have the fork prongs 21 parallel to the front-rear direction when the substrate is transferred with respect to the chambers 7 through 10.

(An Original Position Returning Method of Industrial Robot that has Made an Emergency Stop)

Figure 15A:
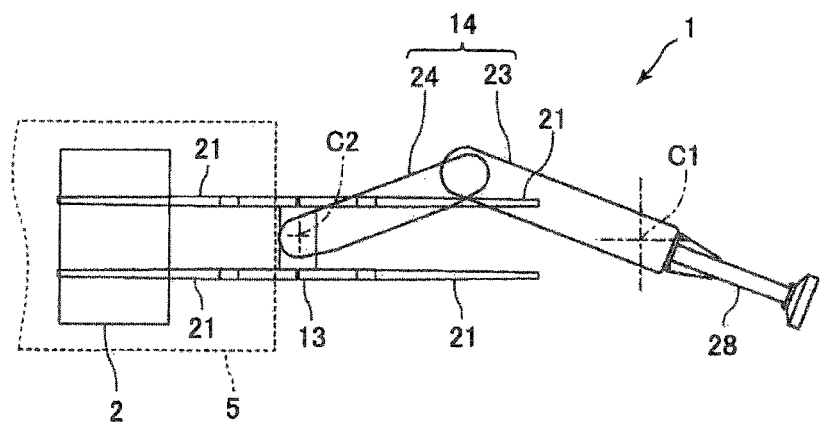
FIGS. 15(A)-15(B) Diagrams to explain the returning process in which the industrial robot shown in FIGS. 2(A)-2(B) that has made an emergency stop, having lost the lost coordinates of its current position, is returned to the original position.
Figure 15B:
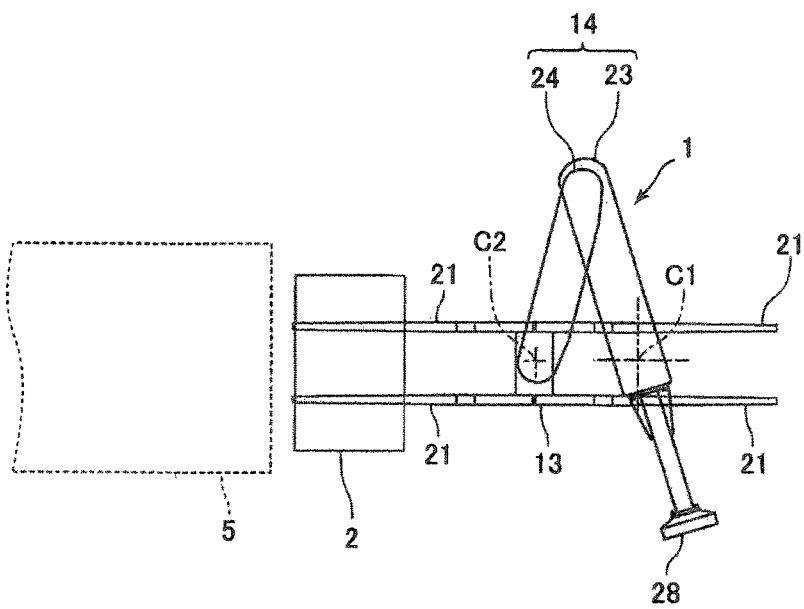

FIGS. 15(A)-(15B) are diagrams to explain the process of returning the industrial robot 1 shown in FIGS. 2(A)-(2B) to the original position when the industrial robot makes an emergency stop, having lost the coordinates of its current position.

When the robot 1 makes an emergency stop, having lost the coordinates of its current position (the current condition) for some causes, the robot 1 is returned to the original position (the reference state) in the following manner. Note that in this embodiment, when the robot 1 makes an emergency stop at the time of transferring the substrate 2 with respect to the chambers 5, 6, the motors 31, 46 and 47 are controlled so as to stop the robot 1 in such a way that the fork prongs 21 are parallel to the left-right direction and the center of rotation C2 is positioned on the imaginary line parallel to the left-right direction passing through the center of rotation C1 when viewed in the top-bottom direction. Also, when the robot 1 makes an emergency stop at the time of transferring the substrate 2 with respect to the chambers 7, 9, the motors 31, 46 and 47 are controlled so as to stop the robot 1 in such a way that the fork prongs 21 are parallel to the front-rear direction and the center of rotation C2 is positioned on the imaginary line parallel to the front-rear direction passing through the center position of each of the chambers 7 and 9 in the left-right direction when viewed in the top-bottom direction. Further, when the robot 1 makes an emergency stop at the time of transferring the substrate 2 with respect to the chambers 8, 10, the motors 31, 46 and 47 are controlled so as to stop the robot 1 in such a way that the fork prongs 21 are parallel to the front-rear direction and the center of rotation C2 is positioned on the imaginary line parallel to the front-rear direction passing through the center position of each of the chambers 8 and 10 in the left-right direction when viewed in the top-bottom direction.

For returning the robot 1 to the original position when the robot 1 makes an emergency stop, having lost the coordinates of its current position, the coordinates representing a temporary current position of the robot 1 is set based on the status of the robot 1 (a temporary current position setting step). In the temporary current position setting step, the coordinates representing a temporary current position of the center of rotation C2 is set. More specifically, an operator who tries to return the robot 1 to the original position determines a temporary current position of the center of rotation C2 by observing and inputs the coordinates of the temporary position of the center of rotation C2 in the teaching operation terminal 19 to set the coordinates of the temporary current position of the center of rotation C2. In other words, in the temporary current position setting step, the teaching operation terminal 19 is used to set the coordinates representing the temporary current position of the center of rotation C2. The teaching operation terminal 19 of this embodiment is a temporary current position setting means for setting the coordinates representing a temporary current position of the center of rotation C2.

Also, in the temporary current position setting step, the coordinates representing a temporary current position of the center of rotation C2 when viewed in the top-bottom direction can be set either by a cylindrical coordinate system which is defined by a plane orthogonal to the top-bottom direction or by a rectangular coordinate system which is defined by a plane orthogonal to the top-bottom direction; thus, the coordinates representing a temporary current position of the center of rotation C2 when viewed in the top-bottom direction can be set by the coordinates of either system. For example, the cylindrical coordinate system is defined having the center of rotation C1 as the original point; based on the distance from the center of rotation C1 to the center of rotation C2 and the angle created by the line connecting the center of rotation C1 and the center of rotation C2 with a predetermined reference line passing through the center of rotation C1, the coordinates representing the temporary current position of the center of rotation C2 when viewed in the top-bottom direction are set. Also, the rectangular coordinate system is defined such that the center of rotation C1 is the original point and one of the coordinate axes of the rectangular coordinate system is parallel to the left-right direction and the other coordinate axis is parallel to the front-rear direction; based on the distance between the center of rotation C1 and the center of rotation C2 in the left-right direction and the distance between the center of rotation C1 and the center of rotation C2 in the front-rear direction, the coordinates representing a temporary current position of the center of rotation C2 when viewed in the top-bottom direction are set.

In this embodiment, when the robot 1 makes an emergency stop at the time of transferring a substrate 2 with respect to the chambers 5, 6 which are arranged such that the imaginary line parallel to the left-right direction passing through the center of rotation C1 passes through the center thereof in the front-rear direction, the coordinates representing a temporary current position of the center of rotation C2 when viewed in the top-bottom direction are set by the cylindrical coordinate system. On the other hand, when the robot 1 makes an emergency stop at the time of transferring a substrate 2 with respect to the chambers 7 through 10 which are respectively offset with respect to the center of rotation C1, the coordinates representing the temporary current position of the center of rotation C2 when viewed in the top-bottom direction are set by the rectangular coordinate system.

Note that, in the temporary current position setting step, in addition to setting the coordinates representing the temporary current position of the center of rotation C2 when viewed in the top-bottom direction, the coordinates representing the temporary current position of the angle of rotation of the hand 13 with respect to the second arm unit 24 and the coordinates of the temporary current position of the height of the center of rotation C2 may be set. These settings are also done as the operator determines a temporary position by looking and inputs the coordinates representing the temporary position in the teaching operation terminal 19. Also, in this embodiment, a predetermined marking is provided to each of the hand 13 and the chambers 5 through 10, and also the coordinates representing the center of rotation C2 when the markings of the hand 13 and the chambers 5 through 10 coincide with each other are determined; when an operator determines the coordinates representing the temporary current position of the center of rotation C2 by looking, the coordinates of the temporary current position of the center of rotation C2 are determined by the positional relationship between the marking on the hand 13 and the markings of the chambers 5 through 10. Alternately, if the coordinates representing the center of rotation C2 when the center of rotation C2 is at the end of its movable range in the front-rear and left-right directions are determined in advance and when an operator determines the coordinates representing the temporary current position of the center of rotation C2 by looking, the coordinates representing the temporary current position of the center of rotation C2 are determined based on the edges of the movable range of the center of rotation C2.

Once the coordinates are set to present the temporary current position of the center of rotation C2 in the temporary current position setting step, the robot 1 is moved to a predetermined position (the moving step). In the moving step, the robot 1 is moved to the position at which the hand 13 or the substrate 2 does not interfere with the chambers 5 through 10 at the time of returning the robot 1 in the returning operation step which is described later. For example, when the robot 1 makes an emergency stop while the left end side of the hand 13 is inside the chamber 5 as shown in FIG. 10(A), the arm 14 is folded in as shown in FIG. 10(B) so that the hand 13 entirely moves out of the chamber 5. When the robot 1 makes an emergency stop while the rear end or the front end of the hand 13 is inside the chamber 7, 8, 9 or 10 as shown in FIG. 6(C), FIG. 7(C), FIG. 8(C) and FIG. 9(C), the arm 14 is folded in so that the hand 13 entirely moves out of the chamber 7, 8, 9 or 10 as shown in FIG. 6(B), FIG. 7(B), FIG. 8(B) and FIG. 9(B).

At that time, the robot 1 is made to perform a linear interpolating operation so that the hand 13 moves in its moving direction at the time of taking the substrate 2 out/in with respect to the chambers 5 through 10. In other words, the robot 1 is made to perform a linear interpolating operation so that the center of rotation C2 moves in its moving direction at the time of taking the substrate 2 out/in with respect to the chambers 5 through 10. Also, in the moving step, the robot 1 is operated by a jogging operation that uses the operation button 71 on the teaching operation terminal 19. The operation button 71 of this embodiment is the operation member for operating the robot 1 in the moving step.

After the robot 1 is moved in the moving step, the robot 1 is automatically returned to the original position (the returning operation step). In the returning operation step, the robot 1 is automatically returned to the original position by a publicly-known method.

(Movement of Industrial Robot at Emergency Stop)

In order to have the robot 1 make an emergency stop for any reason while the hand 13, the first arm unit 23 and the second arm unit 24 are rotating and the main body unit 15 is elevated, the power 81 of the robot 1 is first turned off. Even when having the robot 1 make an emergency stop, the control power source (no illustration) for driving an CPU 79 is delayed for turn-off; while the brakes 41 and 42 and the motor drivers 71 through 74 are being controlled by the CPU 79, the motors 31, 40, 46 and 47 are stopped. For example, the robot 1 delays turning off the control power source by several seconds at its emergency stop.

At the time of having the robot 1 make an emergency stop, the CPU 79 first activates the brake 41 (in other words, electrification to the coil of the brake 41 is stopped); after a predetermined time elapses after activating the brake 41, the brake 42 which has larger braking force is activated (in other words, electrification to the coil of the brake 42 is stopped) to stop the motor 40. In other words, at the time of having the robot 1 make an emergency stop, the CPU 79 activates the brake 41 first, and then activates the brake 42 to stop the motor 40. For example, the CPU 79 activates the brake 42 after several hundred milliseconds have passed since the activation of the brake 41, in order to keep the main body unit 15 from dropping.

Also, at the time of having the robot 1 make an emergency stop, the CPU 79 stops the motor 31, 46 and 47 while controlling the motor drivers 71 through 79 by using the power supplied from the charge-discharge unit 80. In other words, the CPU 79 stops the motors 31, 46 and 47 while administering the positions of rotation of the motors 31, 46 and 47 by using the power which is stored in the charge-discharge unit 80 in advance and the power which is stored in the charge-discharge unit 80 with regenerative current generated by the motors 31, 46 and 47. More specifically described, the CPU 79 stops the motors 31, 46 and 47 while controlling the motor drivers 71 through 73 such that, while maintaining the direction of the hand 13 as in the one when stopped, the hand 13 moves in a straight line in its moving direction [in which the hand was moving] at the time of the emergency stop (more specifically, that the center of rotation C2 moves in a straight line).

Note that, in this embodiment, the CPU 79 controls the motor driver 74 so that the motor 40 will not make a stop more suddenly than necessary when the brakes 41 and 42 are activated at the time of an emergency stop of the robot 1. More specifically, if the motor 40 makes a stop more suddenly than necessary at the time of activation of the brakes 41 and 42, the CPU 79 controls the motor driver 74 so as to further rotate the motor 40 in the rotating direction in which the motor 40 was rotating at the time of the emergency stop. At that time, the power is supplied to the motor driver 74 from the charge-discharge unit 80.

(Method for Controlling Industrial Robot)

Based on the position of the arm 14 and the moving direction of the arm 14, the control unit 100 of this embodiment switches the control of the robot 1 by a cylindrical coordinate system having the center of rotation C1 of the first arm unit 23 with respect to the main body unit 15 (i.e., the center of rotation C1 of the arm 14 with respect to the main body unit 15) as the original point or by a rectangular coordinate system having the center of rotation C1 as the original point. In other words, the control unit 100, based on the position and the moving direction of the arm 14, switches between the control of the motor drivers 71 through 74 by the cylindrical coordinate system and the control of the motor drivers 71 through 74 by the rectangular coordinate system.

More specifically, the control unit 100 controls the robot 1 by a cylindrical coordinate system when the center of rotation C2 of the hand 13 moves in a straight line on an imaginary line passing through the center of rotation C1 when viewed from the top-bottom direction. In other words, when the center of rotation C2 of the hand 13 moves in a straight line on the imaginary line passing through the center of rotation C1 when viewed in the top-bottom direction, the control unit 100 controls the robot 1 by a cylindrical coordinate system based on the distance from the center of rotation C1 to the center of rotation C2 and the angle created by the line connecting the center of rotation C1 and the center of rotation C2 and a predetermined reference line passing through the center of rotation C1.

For example, the control unit 70 controls the robot 1 by the cylindrical coordinate system when, to take a substrate 2 out/in with respect to the chambers 5, 6, the center of rotation C2 moves in a straight line between the position at which the arm 14 is outstretched until the fork prongs 21 go into the chambers 5, 6 (see FIG. 5(A), FIG. 5(C)) and the position at which the arm 14 is folded in until the first arm unit 23 and the second arm unit 24 overlap in the top-bottom direction (see FIG. 5(B)).

The control unit 100 also controls the robot 1 by the cylindrical coordinate system when, to take a substrate 2 out/in with respect to the chambers 7, 8, 9, 10, the center of rotation C2 moves in a straight line between the position at which the arm 14 is folded in until the first arm unit 23 and the second arm unit 24 overlap in the top-bottom direction (see FIG. 6(A), FIG. 7(A), FIG. 8(A), FIG. 9(A)) and the position at which the fork prongs 21 are parallel in the front-rear direction and the substrate 2 is positioned at the front side or the rear side of the hand 13 and the center of rotation C2 agrees with the center of the chambers 7, 8, 9, 10 in the left-right direction (see FIG. 6(B), FIG. 7(B), FIG. 8(B), FIG. 9(B)).

On the other hand, the control unit 100 controls the robot 1 by a rectangular coordinate system when the center of rotation C2 moves in a straight line at the position not along the imaginary line passing through the center of rotation C1 when viewed from the top-bottom direction. In this embodiment, the rectangular coordinate system is so specified that one of the coordinate axes forming the rectangular coordinate system is parallel to the left-right direction and the other axis is parallel to the front-rear direction; when the center of rotation C2 moves in a straight line at the position not along the imaginary line passing through the center of rotation C1 when viewed in the top-bottom direction, the control unit 100 controls the robot 1 by the rectangular coordinate system based on the distance between the center of rotation C1 and the center of rotation C2 in the left-right direction and the distance between the center of rotation C1 and the center of rotation C2 in the front-rear direction.

In other words, the control unit 100 controls the robot 1 by the rectangular coordinate system when, to take the substrate 2 in/out with respect to the chambers 7, 8, 9, 10, the center of rotation C2 moves in a straight line between the position, at which the center of rotation C2 and the center of the chamber 7, 8, 9 or 10 in the left-right direction agree with each other in the left-right direction so that the fork prongs 21 are parallel to the front-rear direction and the substrate 2 is positioned on the front end or the rear end side (see FIG. 6(B), FIG. 7(B), FIG. 8(B), FIG. 9(B)), and the position, at which the arm 14 is outstretched until the fork prongs 21 enter the chamber 7, 8, 9 or 10 (see FIG. 6(C), FIG. 7(C), FIG. 8(C), FIG. 9(C)).

Also, the control unit 100 controls the robot by the cylindrical coordinate system when the first arm is rotated with respect to the main body unit 15 and the hand 13 is not rotated with respect to the second arm unit 24 while the second arm unit 24 is rotated with respect to the first arm unit 23. Also, the control unit 100 controls the robot 1 by the cylindrical coordinate system even when the second arm unit 24 is not rotated with respect to the first arm unit 23 and the hand 13 is not rotated with respect to the second arm unit 24 while the first arm unit is rotated with respect to the main body unit 15.

In this embodiment, the moving position and the like of the center of rotation C2 when the robot is controlled in the cylindrical coordinate system are taught using the coordinates by the cylindrical coordinate system. Also, the moving position of the center of rotation C2 when the robot is controlled in the rectangular coordinate system is taught using the coordinates of the rectangular coordinate system. Note that, no matter whether the robot 1 is controlled in the cylindrical coordinate system or in the rectangular coordinate system, the position of the center of rotation C2 when viewed in the top-bottom direction, the height of the hand 13 and the angle of rotation of the hand 13 with respect to the second arm unit 24 are controlled.

(Major Effects of the Embodiments)

As described above, the interior space 45 of the hollow first arm unit 23 of this embodiment is at atmospheric pressure, in which the motors 46 and 47 and the reduction gears 48 and 49 are arranged. In this embodiment, the reduction gears 48 and 49 arranged in the interior space 45 are coaxially on top of the other so that the axial centers thereof align with each other. In this embodiment, therefore, the thickness of the first arm unit 23 can be increased in the top-bottom direction which is the axial direction of the reduction gears 48 and 49. In other words, the interior space 45 can be enlarged in the top-bottom direction, thus increasing the capacity of the interior space 45 in which the interior pressure is at atmospheric pressure to increase the amount of air inside the interior space 45; as a result, the motors 46 and 47 arranged in the interior space 45 can be cooled down efficiently. Consequently, in this embodiment, the motors 46 and 47 can be prevented from damage due to heat.

In the embodiment of the invention, in particular, the distance between the center of rotation of the second arm unit 24 with respect to the first arm unit 23 and the center of rotation of the first arm unit 23 with respect to the main body unit 15 is equal to that between the center of rotation of the second arm unit 24 with respect to the first arm unit 23 and the center of rotation of the hand 13 with respect to the second arm unit 24, and the first arm unit 23 is relatively long. Therefore, in this embodiment, it is possible to increase the capacity of the interior space 45 to further increase the amount of air in the interior space 45; as a result, the motors 46 and 47 arranged in the interior space 45 can be cooled down more effectively. Also, in this embodiment, a cooling pipe 64 is wound around the motor 46; therefore, the motor 46 can be cooled down even more effectively.

Furthermore, the motors 46 and 47 and the reduction gears 48 and 49 are arranged in the interior space 45 in which the internal pressure is at atmospheric pressure in the embodiment of the invention; therefore, although the hand 13 and the arm 14 are arranged in vacuum, there is no need to use an expensive lubricant such as a vacuum grease as a lubricant for the motors 46 and 47 and the reduction gears 48 and 49, but a general lubricant such as a grease used at atmospheric pressure may be used. Therefore, in this embodiment, the initial cost and the operating cost of the robot 1 can be reduced.

In the embodiment of the invention, part of the joint 26 is configured by the reduction gears 48 and 49. Therefore, rigidity of the joint 26 can be enhanced. In particular, the reduction gears 48 and 49 are hollow reduction gears, and are coaxially arranged so that the axial centers thereof agree with the center of rotation of the second arm unit 24 with respect to the first arm unit 23. In other words, the two reduction gears 48 and 49 are arranged on the center of rotation of the second arm unit 24 with respect to the first arm unit 23 in this embodiment. Therefore, rigidity of the joint 26 can be increased in this embodiment. Accordingly, the joint 26 can be prevented from damage even when the robot 1 handles a relatively large substrate 2.

Note that, if a relatively large substrate 2 is handled with respect the chambers 5 through 10 while the direction of the hand 13 is kept in one direction at the time of taking the substrate 2 out/in the chamber, a large load is applied to the joint 26 but not to the joint 27. Therefore, although the joint 27 is configured by the pulley 61, etc., the joint 27 is hardly damaged.

In the embodiment of the invention, the hand 13 and the first arm unit 23 are rotated at the time of handling the substrate 2 out/in the chamber such that the angle of rotation of the first arm unit 23 with respect to the main body unit 15 is equal to the angle of rotation of the hand 13 with respect to the second arm unit 24 as well as that the direction of rotation of the first arm unit 23 with respect to the main body unit 15 is opposite from that of the hand 13 with respect to the second arm unit 24. Thus, the direction of the hand 13 at the time of handling the substrate 2 out/in the chamber can be kept constant as described above. In other words, the direction of the hand 13 can be kept constant at the time of handling the substrate 2 out/in the chamber by a relatively simple control, according to this embodiment.

In the embodiment of the invention, a counterweight 28 is attached to the first arm unit 23, which projects from the main body unit 15 to one side in the horizontal direction, such that it projects from the main body unit 15 in the direction opposite the projecting direction of the first arm unit 23. For this reason, the load applied to the bearing positioned between the outer circumferential surface of the hollow rotation shaft 32, to which the first arm unit 23 is fixed, and the inner circumferential surface of the holding member 34 can be reduced.

(Major Effects of the Embodiments)

As described above, the coordinates representing a temporary current position of the center of rotation C2 of the robot 1 which has made an emergency stop, having lost the coordinates of its present position is set in the temporary current position setting step; the robot 1 can grasp the coordinates representing the temporary current position of the center of rotation C2. Therefore, in this embodiment, the robot 1 is controlled to make proper movements in the moving step while operating the first arm unit 23, the second arm unit 24, and the hand 13 together, based on the coordinates representing the temporary current position of the center of rotation C2. In other words, in the moving step, the robot 1 can be operated to perform a linear interpolation movement so that the hand 13 moves in the direction in which it was moving at the time of handling the substrate 2 in/out with respect to the chambers 5 through 10; therefore, the interference between the hand 13, the substrate 2 and the chambers 5 through 10 can be prevented in the moving step. Also, since, in the moving step, the robot 1 is moved to the position at which the hand 13 or the substrate 2 does not interfere with the chambers 5 through 10 at the time of returning the robot 1, the robot 1 can safely be returned to the original position in the returning operation step.

Thus, the robot 1 which has stopped, having lost the coordinates of its present position, can easily and safely returned to the original position in the embodiment of the invention, compared to the case in which such robot 1 is returned to the original position by a complex method such as a manual operation by an operator. In particular, the motor 31 rotates the first arm unit 23, the motor 46 rotates the second arm unit 24 and the motor 47 rotates the hand 13; therefore, when the robot 1 which has stopped, having lost the coordinates of its present position, is returned to the original position by the manual operation by an operator, the operation becomes very complicated; however, in this embodiment, the robot 1 can easily be returned to the original position. Note that it is possible to return the robot 1 to the original position using the teaching operation terminal 19 to rotate the first arm unit 23, the second arm unit 24 and the hand 13 little by little individually without setting the coordinates representing a temporary current position of the center of rotation C2. Even in this case, however, the operation becomes complicated.

In the embodiment of the invention, an operator inputs the coordinates of a temporary current position of the center of rotation C2, which he has confirmed and determined by looking, in the teaching operation terminal 19 to set the coordinates representing the temporary current position of the center of rotation C2. Therefore, the temporary current position of the center of rotation C2 can be easily set.

In the embodiment of the invention, the coordinates representing a temporary current position of the center of rotation C2 can be set in either the cylindrical coordinate system or the rectangular coordinate system in the temporary current position setting step; thus, the coordinates representing a temporary current position of the center of rotation C2 can be set in either system. Therefore, in this embodiment, the coordinates representing the temporary current position of the center of rotation C2 can be set by the coordinates in the system in which the robot 1 can be easily moved in the moving step. In other words, as described above, the coordinates in the cylindrical coordinate system are used to set the coordinates representing a temporary current position of the center of rotation C2 when the robot 1 has made an emergency stop at the time of handling the substrate 2 out/in with respect to the chambers 5 and 6 which are arranged such that an imaginary line parallel to the left-right direction passing through the center of rotation C1 passes through the center thereof in the front-rear direction; on the other hand, the coordinates in the rectangular coordinate system are used to set the coordinates representing a temporary current position of the center of rotation C2 when the robot 1 has made an emergency stop at the time of handling the substrate 2 out/in with respect to the chambers 7 through 10 which are off-set with respect to the center of rotation C1.

In the embodiment of the invention, the robot 1 is moved by a jogging operation that uses the operation button 71 of the teaching operation terminal 19. Therefore, even when the difference between the coordinates representing the temporary current position of the center of rotation C2 set in the temporary current position setting step and the coordinates representing the actual current position of the center of rotation C2 of the robot 1 in halt is too great but the robot 1 is continually moved as is in the moving step and therefore the hand 13 with the substrate 2 interferes with the chambers 5 through 10, the interference between the hand 13 with the substrate 2 and the chambers 5 through 10 in the moving step can be prevented by re-setting the coordinates representing the temporary current position while performing the jog operation.

(Major Effects of the Embodiments)

As described above, in this embodiment, the power source 81 is turned off when the robot 1 makes an emergency stop. Therefore, the motors 31, 40, 46 and 47 can be stopped in a relatively short period of time when the robot 1 makes an emergency stop; as a result, safety can be ensured within a short period of time.

In the embodiment of the invention, the CPU 79 controls the motor drivers 71 through 73 to stop the motors 31, 46 and 47 by using the electric power supplied from the charge-discharge unit 80 when the robot 1 makes an emergency stop. In other words, the motors 31, 46 and 47 are stopped while controlled with a use of the power supplied from the charge-discharge unit 80 when the robot 1 makes an emergency stop. Therefore, even if the motor 46 for rotating the first arm unit 23, the motor 47 for rotating the second arm unit 24 and the motor 31 for rotating the hand 13 are separately provided, the CPU 79 stops the motors 31, 46 and 47 while controlling the motor drivers 71 through 73 so that the hand 13 moves in a straight line in the moving direction in which it was moving at the time of the emergency stop while keeping the position in which it was at the time of the emergency stop as described above. Therefore, the contact between the hand 13 and the chambers 5 to 10 and the contact between the arm 14 and the chambers 5 to 10 can be prevented at the time of the emergency stop; as a result, unexpected accidents can be prevented from occurring.

In the embodiment of the invention, the CPU 79 first activates the brake 41 and then activates the brake 42, which has a larger braking force than the brake 41, to stop the motor 40. For this reason, the motor 40 can be stopped by the brakes 41 and 42 within a relatively short period of time in this embodiment. Therefore, even when the robot 1 which cannot be controlled by the motor 40 is forced to make an emergency stop, the main body unit 15 is prevented from falling.

It is preferred that the brake 42 having a larger braking force be activated immediately at the time of an emergency stop. Meanwhile, in this embodiment, the CPU 79 controls the motor driver 74 to rotate the motor 40 further in the direction in which it was rotating at the time of the emergency stop so that the motor 40 does not make a stop more suddenly than necessary when the brakes 41 and 42 are activated at the time of the emergency stop, and the motor driver 74 is supplied with the power from the charge-discharge unit 80. If the brake 42 which has a larger braking force is immediately activated at the time of the emergency stop, the motor 40 easily makes a sudden stop more than necessary; therefore, more power is supplied to the motor driver 74 from the charge-discharge unit 80 to rotate the motor 40 in the direction in which the motor 40 was rotating at the time of the emergency stop; thus, the electric power charged in the charge-discharge unit 80 may be exhausted in a short period of time. If the power charged in the charge-discharge unit 80 is exhausted by the motor driver 74 in a short period of time, the CPU 79 may not be able to control the motor drivers 71 through 73 by using the power supplied from the charge-discharge unit 80, and consequently, the first arm unit 23, the second arm unit 24 and the hand 13 may rotate involuntarily, causing unexpected accidents.

As a measure to the above, in the embodiment of the invention, the CPU 79 first activates the brake 41 to reduce the rotation speed of the motor 40 and then activates the brake 42, which has a larger braking force than the brake 41, to stop the motor 40; therefore, the motor 40 rarely makes a sudden stop, and consequently the power from the charge-discharge unit 80 which is exhausted by the motor driver 74 at the emergency stop can be reduced. Therefore, in this embodiment, even when the CPU 79 controls the motor driver 74 to keep the motor 40 from making a stop more suddenly than necessary when the robot 1 makes an emergency stop, the CPU 79 can control the motor 31, 46 and 47 by using the power supplied from the charge-discharge unit 80 at the time of the emergency stop and stops the motors 31, 46 and 47 while keeping the hand 13 at the position at which the hand was at the time of the emergency stop and moving the hand 13 in a straight line in the direction in which the hand 13 was moving at the time of the emergency stop.

(Major Effects of the Embodiments)

As described above, when the center of rotation C2 of the hand 13 moves in a straight line on an imaginary line passing through the center of rotation C1 when viewed from the top-bottom direction, the robot 1 is controlled in a cylindrical coordinate system; when the center of rotation C2 moves in a straight line at the position not along the imaginary line passing through the center of rotation C1 when viewed in the top-bottom direction, the robot 1 is controlled in a rectangular coordinate system. Therefore, in this embodiment, the moving position of the center of rotation C2 when the robot 1 is controlled in the cylindrical coordinate system is taught by using the coordinates of the cylindrical coordinate system while the moving position of the center of rotation C2 when the robot 1 is controlled in the rectangular coordinate system can be taught by using the coordinates of the rectangular coordinate system. In other words, in this embodiment, when the center of rotation C2 moves in a straight line at the position not along the imaginary line passing through the center of rotation C1 when viewed in the top-bottom direction, the moving position of the center of rotation C2 can be taught not using the coordinates of the cylindrical coordinate system but using the coordinates of the rectangular coordinate system. Therefore, even when the center of rotation C2 moves in a straight line at the position not along the imaginary line passing through the center of rotation C1 when viewed in the top-bottom direction, the moving position of the center of rotation C2 can easily be taught.

In the embodiment of the invention, particularly, the rectangular coordinate system is so specified that one of the coordinate axes creating the rectangular coordinate system is parallel to the left-right direction and the other coordinate axis is parallel to the front-rear direction; when the center of rotation C2 moves in a straight line at the position not long the imaginary line passing through the center of rotation C1 when viewed in the top-bottom direction, the center of rotation C2 moves in a straight line on an imaginary line passing through the centers of the chambers 7 to 10 in the left-right direction and parallel to the front-rear direction. Therefore, in this embodiment, the moving position of the center of rotation C2 when it move on a straight line at the position not along the imaginary line passing through the center of rotation C1 when viewed in the top-bottom direction can more easily taught by using the coordinates of the rectangular coordinate system.

In the embodiment of the invention, the robot 1 is controlled in the cylindrical coordinate system when the center of rotation C2 moves in a straight line on the imaginary line passing through the center of rotation C1 when viewed in the top-bottom direction; on the other hand, the robot 1 is controlled in the rectangular coordinate system when the center of rotation C2 moves in a straight line at the position not along the imaginary line passing through the center of rotation C1 when viewed in the top-bottom direction. Thus, the control of the robot 1 is facilitated.

Modification Example 1 of Industrial Robot

Figure 10:
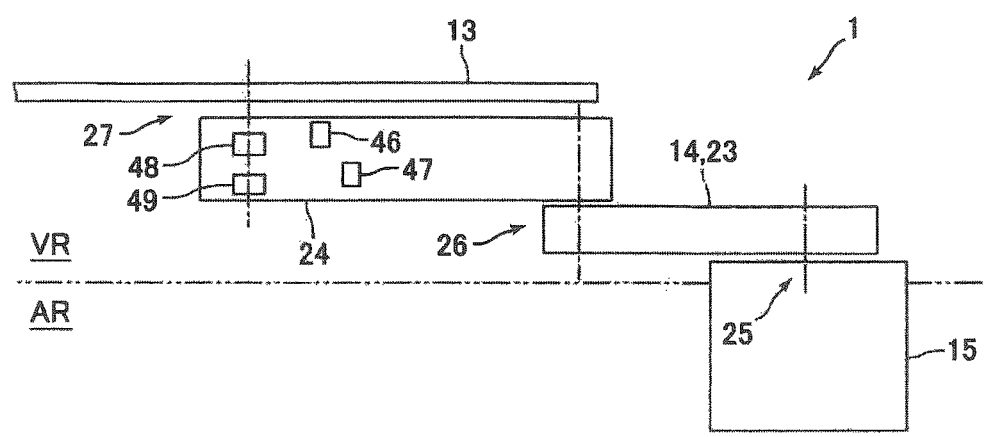
FIG. 10 A diagram to explain the configuration of the industrial robot of another embodiment of the present invention from the side.

FIG. 10 is a diagram to explain the configuration of the industrial robot 1 of another embodiment of the invention from the side.

In the above-described embodiment of the invention, the motors 46 and 47 and the reduction gears 48 and 49 are arranged in the interior space 45 of the first arm unit 23. More specifically described, the motors 46 and 47 and the reduction gears 48 and 49 are arranged in the interior space 45 in the front end of the first arm unit 23, and the reduction gears 48 and 49 configure part of the joint section 26. Alternately, the motors 46 and 47 and the reduction gears 48 and 49 may be arranged in the interior space of the second arm unit 24 in which the interior pressure is at atmospheric pressure. For example, the motors 46 and 47 and the reduction gears 48 and 49 may be arranged in the internal space in the base end of the second arm unit 24. In this case, the reduction gears 48 and 49 are arranged to coaxially overlap so such that the axial centers thereof coincide with the center of rotation of the second arm unit 24 with respect to the first arm unit 23, and they configure part of the joint section 26. Note that the interior space 45 of the first arm unit in this case may be in vacuum.

As shown in FIG. 10, the motors 46 and 47 and the reduction gears 48 and 49 may be arranged in the interior space in the front end of the second arm unit 24. In this case, the reduction gear 48 and the reduction gear 49 are arranged to coaxially be on top of the other so that their axial centers agree with the center of rotation of the hand 13 with respect to the second arm unit 24, and they also configure part of the joint section 27. Even in this case, the interior space of the second arm unit 24 can be made larger in the top-bottom direction which is the axial direction of the reduction gears 48 and 49; therefore, the capacity of the interior space of the second arm unit 24 in which the internal pressure is at atmospheric pressure can be increased to further increase the amount of air within the interior space of the second arm unit 24. Thus, the motors 46 and 47 arranged in the interior space of the second arm unit 24 can efficiently be cooled down. In this case, the two reduction gears 48 and 49 are arranged on the center of rotation of the hand 13 with respect to the second arm unit 24; therefore, rigidity of the joint section 27 can be enhanced.

Modification Example 2 of Industrial Robot

Figure 11:
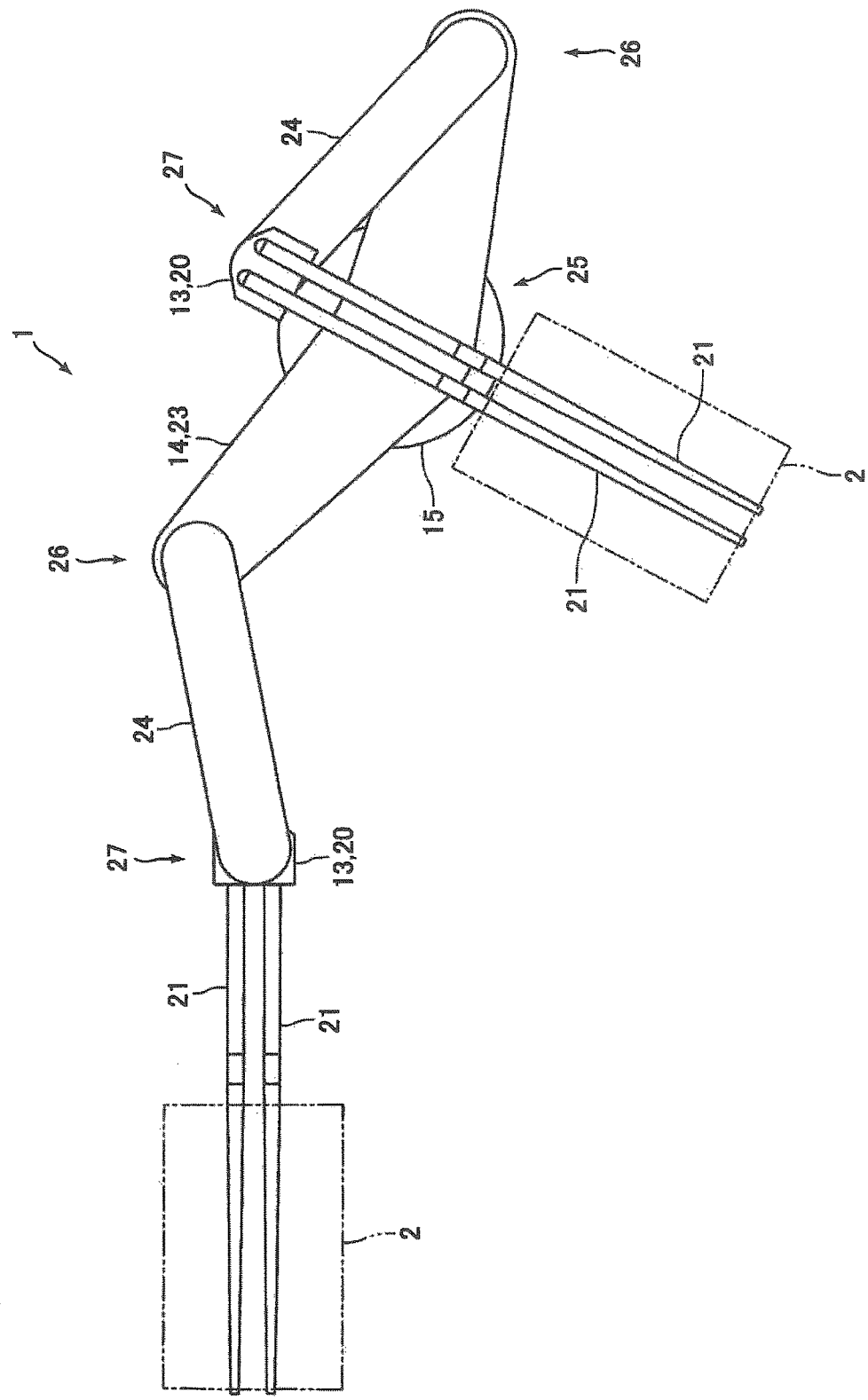
FIG. 11 A plan view of an industrial robot of another embodiment of the present invention.

FIG. 11 is a plan view of an industrial robot 1 of another embodiment of the invention.
In the above-described embodiment of the invention, the arm 14 is configured by the first arm unit 23 and the second arm unit 24. Alternately, as shown in FIG. 11, the arm 14 may be configured by a first arm unit 23 and two second arm units 24. In this case, the first arm unit 23 is formed in a V-shape or linearly and the center thereof is made as a base end section which is rotatably linked with the main body unit 15. Also, as shown in FIG. 11, each of the two second arm units 24 is rotatably linked to each of the two front ends of the first arm unit 23, and the joint section 26 is formed at each of the two front ends of the first arm unit 23.
Even in this case, part of the joint section 26 is configured by the reduction gears 48 and 49 in the same manner as the above-described embodiment; the motors 46 and 47 and the reduction gears 48 and 49 are arranged in the interior space 45 in each of the two front ends of the first arm unit 23. Also, the interior space 45 is kept at atmospheric pressure. Note that, in this case, only two fork prongs 21 projecting to one side in the horizontal direction are attached to the base section 20 of the hand 13. In FIG. 11, the same codes are given to the same configuration as or the configuration corresponding to the above-described embodiment.

Modification Example 3 of Industrial Robot

Figure 12:
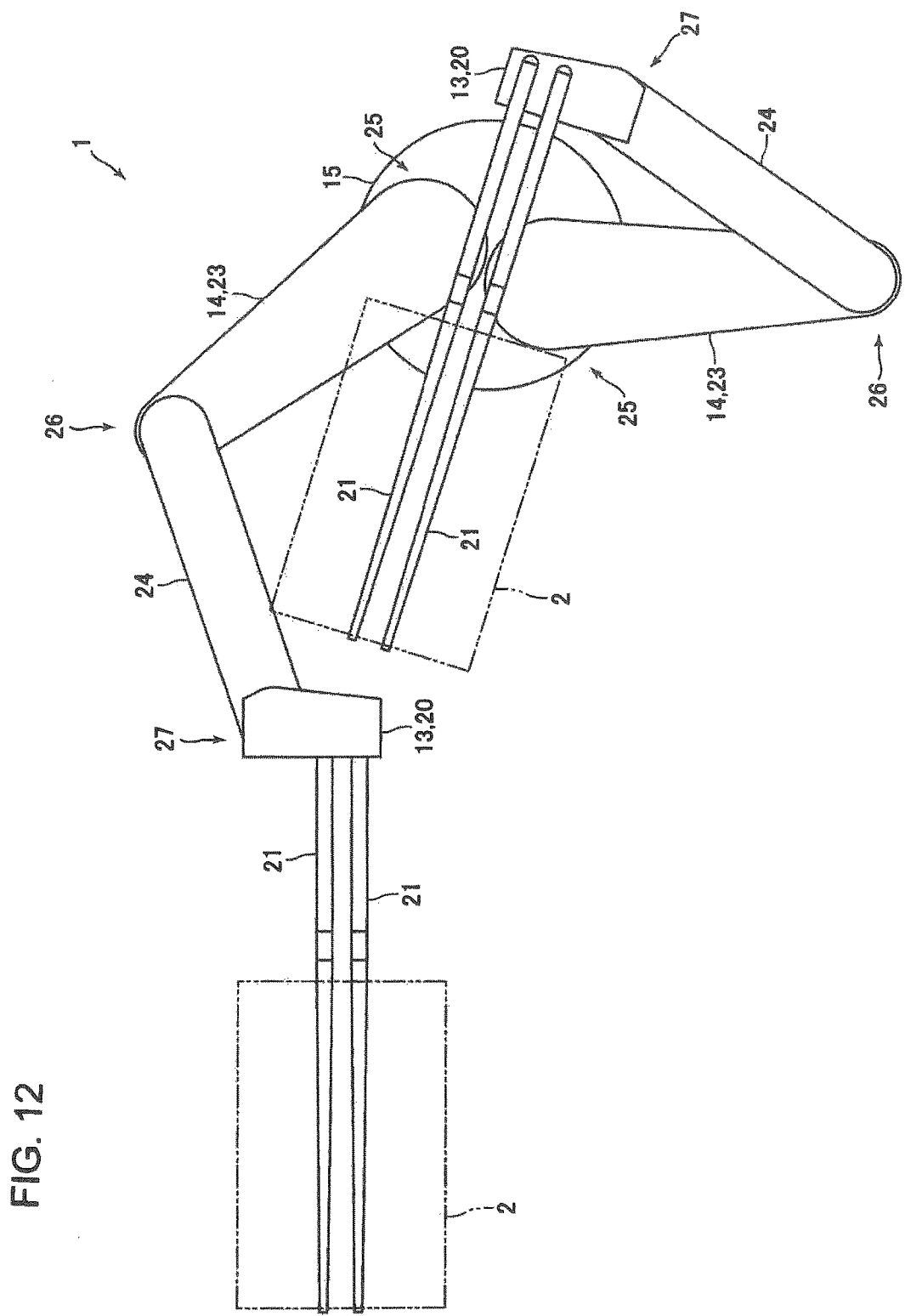
FIG. 12 A plan view of an industrial robot of another embodiment of the present invention.

FIG. 12 is a plan view of an industrial robot 1 of another embodiment of the invention.
In the above-described invention, the robot 1 is provided with one arm 14. Alternately, as shown in FIG. 12, the robot 1 may be provided with two arms 14 which are rotatably linked to the main body unit 15 with their base ends. Even in this case, part of the joint section 26 is configured by the reduction gears 48 and 49 in the same manner as the above-described embodiment; the motors 46 and 47 and the reduction gears 48 and 49 are arranged in the interior space 45 in the front end of the first arm unit 23. Also, the interior space 45 is kept at atmospheric pressure. Note that, in this case, only two fork prongs 21 projecting to one side in the horizontal direction are attached to the base section of the hand 13. In FIG. 12, the same codes are given to the same configuration or the configuration corresponding to the above-described embodiment.

Modification Example 4 of Industrial Robot

Figure 13A:
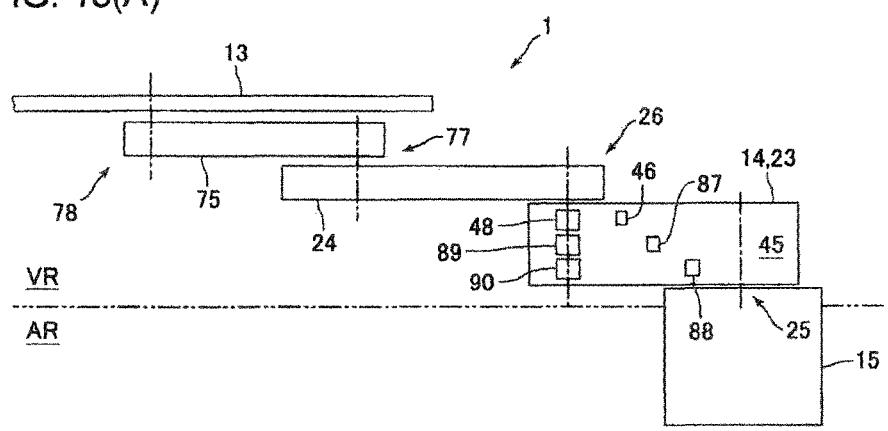
FIGS. 13(A)-13(B) A diagram to explain the configuration of the industrial robot of another embodiment of the present invention from the side.
Figure 13B:
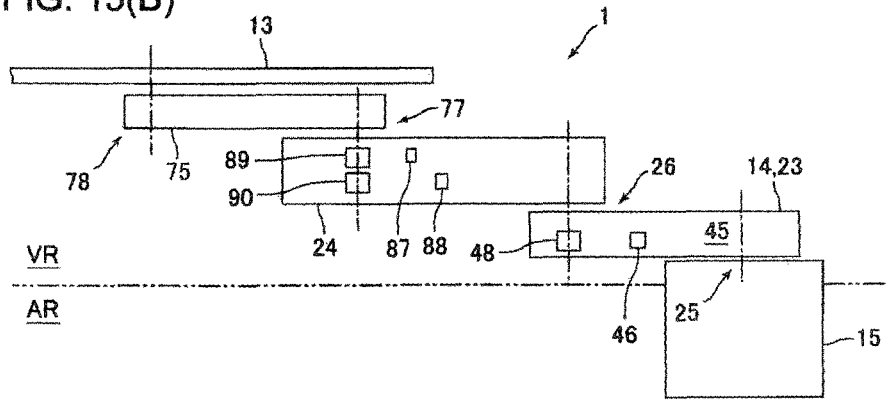

FIGS. 13(A)-13(B) are diagrams to explain the configuration of an industrial robot 1 of another embodiment of the invention from the side.

In the above-described embodiment of the invention, the arm 14 is configured by two arm units which are the first arm unit 23 and the second arm unit 24. Alternately, as shown in FIGS. 13(A)-13(B), the arm 14 may be configured by three arm units which are the first arm unit 23, the second arm unit 24 and an third arm unit 75. In this case, the base end of the first arm unit 23 is rotatably linked to the main body unit 15 and the base end of the second arm unit 24 is rotatably linked to the front end of the first arm unit 23 in the same manner as the above-described embodiment. Also, the base end of the third arm unit 75 is rotatably linked to the front end of the second arm unit 24 and the hand 13 is rotatably linked to the front end of the third end of the third arm unit 75.
Further, in the same manner as the above-described embodiment of the invention, the connection between the first arm unit 23 and the second arm unit 24 is made as the joint section 26, and the robot 1 is provided with the motor 46 as the first motor for rotating the second arm unit 24 with respect to the first arm unit 23 and the reduction gear 48 as the first reduction gear for reducing the rotation of the motor 46 and transmitting it to the second arm unit 24. Also, the connection between the second arm unit 24 and the third arm unit 75 is made as the joint section 77, and the connection between the third arm unit 75 and the hand 13 is made as the joint section 78. The robot 1 is provided with a motor 87 as the second motor for rotating the third arm unit 75 with respect to the second arm unit 24, a motor 88 as the third motor for rotating the hand 13 with respect to the third arm unit 75, a reduction gear 89 as the second reduction gear for reducing the rotation of the motor 87 and transmitting it to the third arm unit 75 and a reduction gear 90 as the third reduction gear for reducing the rotation of the motor 88 and transmitting it to the hand 13. The reduction gears 89 and 90 are hollow reduction gears in which a through hole is formed in the center thereof in the radial direction, in the same manner as the reduction gear 48. Note that, in this case, the joint section 26 is the first joint section, the joint section 77 is the second joint section and the joint section 78 is the third joint section.
The reduction gears 48, 89 and 90 are arranged to be coaxially on top of the other, as shown in FIG. 13(A), so that their axial centers coincide with the center of rotation of the second arm unit 24 with respect to the first arm unit 23, and also they configure part of the joint section 26. Further, the motors 46, 87 and 88 and the reduction gears 48, 89 and 90 are arranged in the interior space 45 of the first arm unit 23. The interior space 45 is kept at atmospheric pressure. Note that, in this case, the motors 46, 87 and 88 and the reduction gears 48, 89 and 90 may be arranged in the interior space of the second arm unit in which the pressure of the hollow interior is kept at atmospheric pressure.
For example, the reduction gears 48, 89 and 90 may be arranged to be coaxially on top of the other so that their axial centers coincide with the center of rotation of the third arm unit 75 with respect to the second arm unit 24, and also they configure part of the joint section 77. In this case, the motors 46, 87 and 88 and the reduction gears 48, 89 and 90 are arranged in the interior space of the hollow second arm unit 24 or the hollow third arm unit 75 in which the interior pressure is kept at atmospheric pressure. Alternately, the reduction gears 48, 89 and 90 may be arranged to be coaxially on top of the other so that their axial centers coincide with the center of rotation with the hand 13 with respect to the third arm unit 75, and they may configure part of the joint section 78. In this case, the motors 46, 87 and 88 and the reduction gars 48, 89 and 90 are arranged in the interior space of the hollow third arm unit 75 in which the interior pressure is kept at atmospheric pressure.

Alternately, as shown in FIG. 13(B), the reduction gear 48 may be so arranged that its axial center coincides with the center of rotation of the second arm unit 24 with respect to the first arm unit 23 and it may configure part of the joint section 26 as well as the reduction gears 89 and 90 may be arranged to be coaxially on top of the other so that their axial centers coincide with the center of rotation of the third arm unit 75 with respect to the second arm unit 24 and it may configure part of the joint section 77. In this case, the motor 46 and the reduction gear 48 are arranged in the interior space 45 of the first arm unit 23 in which the interior pressure is kept at atmospheric pressure, and the motors 87 and 88 and the reduction gears 89 and 90 are arranged in the interior space of the hollow second arm unit 24 in which the interior pressure is kept at atmospheric pressure. Note that, in this case, the motor 46 and the reduction gear 48 may be arranged in the interior space of the second arm unit 24 in which the interior pressure is kept at atmospheric pressure (more specifically, the interior space in the base end of the second arm unit 24). Alternately, in this case, the motors 87 and 88 and the reduction gears 89 and 90 may be arranged in the interior space of the hollow third arm unit 75 in which the interior pressure is kept at atmospheric pressure.

In the same manner, any two reduction gears selected out of the three reduction gears 48, 89 and 90 may be arranged to be coaxially on top of the other so that their axial centers coincide with the center of rotation of the second arm unit 24 with respect to the first arm unit 23, the center of rotation of the third arm unit 75 with respect to the second arm unit 24 or the center of rotation of the hand 13 with respect to the third arm unit 75, and also they may configure part of the joint section 26, 77 or 78. In this case, the two reduction gears, which are to be coaxially arranged on top of the other, and two motors out of the motors 46, 87 and 88, which are to be connected with the two reduction gears, are arranged in the interior space of the first arm unit 23, the second arm unit 24 or the third arm unit 75 in which the interior pressure is kept at atmospheric pressure. Meanwhile the remaining one reduction gear and the motor connected to this reduction gear are arranged in the interior space of the first arm unit 23, the second arm unit 24 or the third arm unit 75 in which the interior pressure is kept at atmospheric pressure.

Even such configurations can bring the same effects as the above-described embodiment.

When the arm 14 is configured by three arm units, the robot 1 may be provided with a first motor for stretching out/folding in the arm 14 (in other words, the first motor for rotating the second arm unit 24 and the third arm unit 75 together), a second motor for rotating the hand 13 with respect to the third arm unit 75, a first reduction gear for reducing the rotation of the first motor and transmitting it to the arm 14 and a second reduction gear for reducing the rotation of the second motor and transmitting it to the hand 13.

In this case, the first reduction gear and the second reduction gear are hollow reduction gears in which a through hole is formed in its center in the radial direction; the first reduction gear and the second reduction gear are arranged coaxially on top of the other so that their axial centers coincide with the center of rotation of the second arm unit 24 with respect to the first arm unit 23, the center of rotation of the third arm unit 75 with respect to the second arm unit 24 or the center of rotation of the hand 13 with respect to the third arm unit 75, and they configure part of the joint section 26, the joint section 77 or the joint section 78. Further, in this case, the first motor, the second motor, the first reduction gear and the second reduction gear are arranged in the interior space of the hollow first arm unit 23, the hollow second arm unit 24 or the hollow third arm unit 75 in which the interior pressure is kept at atmospheric pressure. Even in this case, the same effect as the above-described embodiment can be obtained.

Modification Example 5 of Industrial Robot

In the above-described embodiment of the invention, the arm 14 is configured by two arm units which are the first arm unit 23 and the second arm unit 24; however, the arm may be configured by four arm units. In this case, the arm is configured by a first arm unit rotatably which is linked to the main body unit 15 with the base end thereof, a second arm unit which is rotatably linked to the front end of the first arm unit with the base end thereof, a third arm unit which is rotatably linked to the front end of the second arm unit with the base end thereof, and a fourth arm unit which is rotatably linked to the front end of the third arm unit with the base end thereof. The hand 13 is rotatably linked to the front end of the fourth arm unit. The robot 1 is provided with a first motor for rotating the second arm unit with respect to the first arm unit, a second motor for rotating the third arm unit with respect to the second arm unit, a third motor for rotating the fourth arm unit with respect to the third arm unit, a fourth motor for rotating the hand with respect to the fourth arm unit, a first reduction gear for reducing the rotation of the first motor and transmitting it to the second arm unit, a second reduction gear for reducing the rotation of the second motor and transmitting it the third arm unit, a third reduction gear for reducing the rotation of the fourth motor and transmitting it to the fourth arm unit, and a fourth reduction gear for reducing the rotation of the fourth motor and transmitting it to the hand.

In this case, also, the first, second, third and fourth reduction gears are hollow reduction gears in the same manner as the reduction gear 48 in which a through hole is formed in its center in the radial direction. Two or more out of the four reduction gears are arranged coaxially on top of the other so that the axial centers thereof coincide with the center of rotation of the second arm unit with respect to the first arm unit, the center of rotation of the third arm unit with respect to the second arm unit, the center of rotation of the fourth arm unit with respect to the third arm unit or the center of rotation of the hand with respect to the fourth arm unit, and they also configure at least part of a first joint section between the first arm unit and the second arm unit, a second joint section between the second arm unit and the third arm unit, a third joint section between the third arm unit and the fourth arm unit, or a fourth joint section between the fourth arm unit and the hand. In the interior space of the hollow first, second, third or fourth arm unit in which the interior pressure is kept at atmospheric pressure, two or more reduction gears which are arranged coaxially on top of the other and two or more motors out of the first motor, the second motor, the third motor and the fourth motor which are connected to the said two or more reduction gears are arranged.

Even in this case, the same effect as the above-described embodiment can be obtained. Note that the arm may be configured by five or more arm units.

OTHER EMBODIMENTS

The above-described embodiment is an example of preferred embodiments of the present invention; however, the present invention is not limited to this, but can be varyingly modified within the scope of the invention.

In the above-described embodiment of the invention, an object-to-be-handled which the robot 1 handles is an organic ELD substrate 2; however, an object-to-be-handled which the robot 1 handles may be an LCD glass substrate or a semi-conductor wafer. In the above-described embodiment, the robot 1 is for handling an object-to-be-handled; however, it may be a robot which is used for another purpose such as a soldering robot.

In the above-described embodiment of the invention, the coordinates representing a temporary current position of the center of rotation C2 is input to the teaching operation terminal 19 in the temporary current position setting step to set the coordinates representing the temporary current position of the center of rotation C2. Alternately, the coordinates representing a temporary current position of the center of rotation C2 may be input to an operation panel used to operate the robot 1 to set the coordinates representing the temporary current position of the center of rotation C2. The operation panel in this case is installed in a robot-operation room where an operator operates.

In the above-described embodiment of the invention, the robot 1 is moved by a jogging operation which uses the operation button 76 on the teaching operation terminal 19 in the moving step. Alternately, the robot 1 may be moved through a jogging operation which uses an operation button or the like provided on an operation panel on the robot 1 in the moving step. Also, in the above-described embodiment, the robot 1 is moved by a jogging operation in the moving step; however, the robot 1 may be moved by an automated operation which moves the robot 1 continually in the moving step.

In the above-described embodiment of the invention, the teaching operation terminal 19 is provided with the operation button 76. Alternately, the teaching operation terminal 19 may be provided with an operation lever in place of the operation button 76. In this case, the robot 1 is moved through a jogging operation which uses the operation lever on the teaching operation terminal 19 in the moving step. The operation lever in this case is the operation member for moving the robot 1 in the moving step.

In the above-described embodiment of the invention, the arm 14 is configured by the first arm unit 23 and the second arm unit 24. Alternately, the arm 14 may be configured by three or more arm units. In this case, as many motors as arm units are provided to rotate the three or more arm units individually. Also, in this case, the number of the motors to rotate the multiple arm units may be fewer than the number of the arm units.

In the above-described embodiments, a single hand 13 is linked to the front end of the arm 14. Alternately, two hands many be linked to the front end of the arm 14. In this case, two motors may be provided to rotate the two hands individually, or a single motor may be provided to rotate the two hands together. Furthermore, three or more hands may be linked to the front end of the arm 14.

In the above-described embodiments, part of the robot 1 is arranged in vacuum. Alternately, the entire robot 1 may be placed in vacuum or in air. In the above-described embodiments, an object-to-be-handled which the robot 1 handles is an organic ELD substrate 2; however, it may be an LCD glass substrate or a semiconductor wafer. Also, in the above-described embodiments, the robot 1 is a horizontal articulated robot; however, an industrial robot to which the configuration of the present invention is applied may be a vertical articulated robot such as a soldering robot which has an arm configured by multiple arm units. Further, in the above-described embodiment, the hand 13 is rotatably linked to the front end of the arm 14; however, an end-effector other than the hand 13 may be linked at the front end of the arm 14.

In the above-described embodiment of the invention, the elevating mechanism 16 is provided with the brakes 41 and 42; when the robot 1 makes an emergency stop, the brake 41 is first activated and then the brake 42 is activated to stop the motor 40. Alternately, the elevating mechanism 16 may be provided with only the brake 42 which has a larger braking force if a large amount of electricity is stored in the charge-discharge unit 80. In this case, the brake 42 is immediately activated to stop the motor 40 when the robot 1 makes an emergency stop.

In the above-described embodiment of the invention, the arm 14 is configured by the first arm unit 23 and the second arm unit 24. Alternately, the arm 14 may be configured by three or more arm units. In this case, the number of motors for rotating the three or more arm units is the same as the number of arm units. In other words, the motors are provided as many as the arm units to rotate the three or more arm unit individually. In this case, also, the motors may be provided less than the arm units if there are two or more motors are provided to rotate the three or more arm units. In other words, if two or more motors are provided to rotate three or more arm units, a motor may be provided to rotate two or three arm units altogether.

In the above-described embodiment of the invention, the robot 1 is provided with the elevating mechanism 16; however, the robot 1 may not be provided with the elevating mechanism 16. Even in this case, the CPU 79 stops the motors 31, 46 and 47 while controlling the motor drivers 71 through 73 by using the power supplied from the charge-discharge unit 80 when the robot 1 makes an emergency stop.

While the description above refers to particular embodiments of the present invention, it will be understood that many modifications may be made without departing from the spirit thereof. The accompanying claims are intended to cover such modifications as would fall within the true scope and spirit of the present invention.

The presently disclosed embodiments are therefore to be considered in all respects as illustrative and not restrictive, the scope of the invention being indicated by the appended claims, rather than the foregoing description, and all changes which come within the meaning and range of equivalency of the claims are therefore intended to be embraced therein.

The invention claimed is:

1. A method for returning an industrial robot to an original position, comprising:
   providing a manufacturing system comprising a transfer chamber, a plurality of process chambers connected to the transfer chamber, and the industrial robot, the industrial robot comprising:
      a plurality of arm units, the plurality of arm units being rotatably linked to each other;
      a hand rotatably linked to an end arm of the plurality of arm units;
      a plurality of arm-driving motors for rotating the plurality of arm units; and
      a hand-driving motor for rotating the hand;
   in response to the industrial robot stopping and losing its coordinates, observing coordinates of a center of rotation of the hand with respect to the end arm and setting coordinates of a temporary current position of the industrial robot which has stopped with its coordinates lost by inputting the coordinates of the center of rotation of the hand with respect to the end arm into a portable teaching operation terminal connected to the industrial robot;

controlling the plurality of arm-driving motors and hand-driving motor to move the industrial robot to a predetermined position, the predetermined position being a position where the hand is removed from plurality of process chambers; and controlling the plurality of arm-driving motors and hand-driving motor to move the industrial robot to the original position from the predetermined position.

2. The method for returning an industrial robot to an original position as set forth in claim 1, wherein, when viewed in the top-bottom direction which is the axial direction of the rotation of the hand, the hand moves in a straight line to take an object-to-be-handled into the process chamber or to take the object-to-be-handled out of the process chamber;

in the moving the industrial robot, the industrial robot is made to perform a linear interpolation move so that the hand is moved in the direction, in which the hand was moving during the time of taking the object-to-be-handled in and out, as viewed in the top-bottom direction.

3. The method for returning an industrial robot to an original position as set forth in claim 1, wherein, in the setting coordinates of a temporary current position, the coordinates representing a temporary current position of the center of rotation of the hand viewed in the top-bottom direction can be set by either coordinates of a cylindrical coordinate system or coordinates of a rectangular coordinate system, which are specified in a plane orthogonal to the top-bottom direction which is the axial direction of the rotation of the hand, and the coordinates representing a temporary current position of the center of rotation of the hand viewed in the top-bottom direction are set by the coordinates of the cylindrical coordinate system or the coordinates of the rectangular coordinate system.

4. The method for returning an industrial robot to an original position as set forth in claim 1, wherein the industrial robot is provided with an operation member to operate the industrial robot in the moving step; and in the moving the industrial robot, the industrial robot is operated by a jogging operation by which the industrial robot moves while an operator of the industrial robot is operating the operation member and stops when the operator stops operating the operation member.

* * * * *